United States Patent
Zhang

(10) Patent No.: US 8,384,497 B2
(45) Date of Patent: Feb. 26, 2013

(54) PIEZOELECTRIC RESONATOR STRUCTURE HAVING AN INTERFERENCE STRUCTURE

(76) Inventor: Hao Zhang, Zhuhai (CN)

(*) Notice: Subject to any disclaimer, the term of this patent is extended or adjusted under 35 U.S.C. 154(b) by 556 days.

(21) Appl. No.: 12/641,697

(22) Filed: Dec. 18, 2009

(65) Prior Publication Data

US 2011/0148547 A1 Jun. 23, 2011

(51) Int. Cl.
*H03H 9/15* (2006.01)
*H03H 9/13* (2006.01)
*H03H 9/54* (2006.01)

(52) U.S. Cl. ........ 333/187; 333/189; 310/322; 310/324; 310/365

(58) Field of Classification Search .......... 333/187–189; 310/312, 322, 324, 326, 334, 335, 365
See application file for complete search history.

(56) References Cited

U.S. PATENT DOCUMENTS

| | | | |
|---|---|---|---|
| 6,204,737 B1* | 3/2001 | Ella | 333/187 |
| 7,280,007 B2 | 10/2007 | Feng et al. | |
| 7,456,707 B2* | 11/2008 | Tsurumi et al. | 333/187 |
| 7,541,717 B2* | 6/2009 | Schmidhammer | 310/320 |
| 7,567,023 B2* | 7/2009 | Iwaki et al. | 310/365 |
| 8,084,919 B2* | 12/2011 | Nishihara et al. | 310/320 |
| 8,248,185 B2* | 8/2012 | Choy et al. | 333/187 |
| 2002/0158716 A1* | 10/2002 | Pensala | 333/195 |
| 2006/0132262 A1* | 6/2006 | Fazzio et al. | 333/187 |
| 2008/0129417 A1* | 6/2008 | Taniguchi et al. | 333/192 |
| 2009/0267453 A1* | 10/2009 | Barber et al. | 310/322 |
| 2010/0327994 A1* | 12/2010 | Choy et al. | 333/187 |
| 2011/0084779 A1* | 4/2011 | Zhang | 333/187 |
| 2012/0326807 A1* | 12/2012 | Choy et al. | 333/188 |

\* cited by examiner

*Primary Examiner* — Barbara Summons
(74) *Attorney, Agent, or Firm* — Morris Manning & Martin LLP; Tim Tingkang Xia, Esq.

(57) ABSTRACT

A piezoelectric resonator structure, comprising: (i) a substrate, (ii) an acoustic mirror, (iii) a first electrode, (iv) a piezoelectric layer, and (v) a second electrode, wherein each of the substrate, the acoustic mirror, the first electrode, the piezoelectric layer, and the second electrode has a top surface and a bottom surface, a first end portion and an opposite, second end portion, and a body portion defined therebetween, wherein the overlapped area of body portions of the substrate, the acoustic mirror, the first electrode, the piezoelectric layer and the second electrode is defined as an active area A. A plurality of air gaps and interference structures is formed at the first end portion of the piezoelectric layer and the second electrode, and the second end portion of the piezoelectric layer and the second electrode to enhance the performance of the piezoelectric resonator.

17 Claims, 15 Drawing Sheets

PIEZOELECTRIC RESONATOR STRUCTURE HAVING AN INTERFERENCE STRUCTURE

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to bulk acoustic wave devices, and more particular to thin film piezoelectric resonator structure having enhanced electrical performance.

BACKGROUND OF THE INVENTION

Piezoelectric bulk acoustic wave resonators employed in radio-frequency (RF) filters for wireless communication equipments are generally characterized into two major types. One type is called film bulk acoustic resonator (FBAR). A typical FBAR consists of a piezoelectric layer and two metal electrodes sandwiching the piezoelectric layer. Both metal electrodes are interfaced with air to trap acoustic energy in the piezoelectric resonator body. In practical configurations, additional layers to the metal electrodes of an FBAR may be added to enhance functionality such as physical strength, passivation, temperature compensation and the like. The other type is called solidly mounted resonator (SMR). In an SMR, an acoustic mirror comprising alternating low and high acoustic impedance layers takes the place of air on one or both sides of an FBAR. The acoustic mirror stack exhibits extremely high or low acoustic impedance so acoustic energy is well trapped in the resonator body of an SMR.

Both types of the piezoelectric bulk acoustic wave resonators provide effective electromechanical coupling ($Kt^2_{eff}$) and quality factor (Q) needed for high performance filters and duplexers used in wireless communication equipments (such as cell phones). The product of the $Kt^2_{eff}$ and Q represents the figure of merit (FOM) of the resonator. In general, the greater the FOM is the more likely the filter containing the resonator reaches desired performance.

Each piezoelectric material has an intrinsic electromechanical coupling constant ($Kt^2$) which indicates the conversion efficiency between electric and acoustic energy in the piezoelectric material. When both sides of the piezoelectric layer are loaded with metal electrodes and additional layers, the entire device presents the $Kt^2_{eff}$ which can be derived from formula calculation with a series resonant frequency ($f_s$) and a parallel resonant frequency ($f_p$). It has been demonstrated that $Kt^2_{eff}$ is dependent on electrode thickness and at a certain thickness ratio of metal electrode and piezoelectric layer the $Kt^2_{eff}$ could be greater than the $Kt^2$. Generally, the resonator with a greater $Kt^2_{eff}$ can be used to make filters of a broader bandwidth.

The Q factor is the amount of acoustic energy stored in a resonator divided by the amount of energy lost to the resonator by various means. If the resonator is operating in a purely piston mode, the Q factor of the resonator is limited only by the mechanical Q factor of materials in the resonator. In a resonator with finite size, there are other operation modes co-existing with the main piston mode. Since the piston mode is the main concern, other operation modes may be called spurious modes and lateral mode is one of the spurious modes. Lateral modes are generated with an excitation of the piston operation mode and propagated in parallel to the resonator surface from one edge to the other. Standing waves occur due to lateral modes excited at resonator edges traveling in opposite directions in the active region of resonator. Waves of the lateral modes may leak out from the sides of the resonator and escape into the substrate, resulting in reduction of the Q factor near parallel resonant frequency ($Q_p$) of the resonator.

It is easier to form lateral modes in a smaller size piezoelectric resonator than in a larger size resonator, because the lateral waves travel a shorter path after they are reflected by the opposite side of the resonator and bounced back to its original side. One of the approaches to minimize the lateral modes for a small size resonator is to combine two double-sized resonators in series to replace one single resonator to suppress the spurious modes and increase the $Q_p$ of the resonator. Although the performance may have been improved, the dimension of each die is increased, so does the cost of manufacturing the die. This is contradicted to a common goal of reducing the cost.

An alternative approach to minimize the lateral modes is to "apodize" the edges of the resonator, namely truncating a portion of the resonator such that any two edges of the resonator may not be made parallel. In contrast to a square-edged or a rectangular-edged resonator, lateral acoustic wave in an apodized resonator travels much longer due to multiple reflections before it is bounced back to its original edge. Apodization increases the propagation path of the lateral acoustic wave and reduces the fundamental lateral mode resonant frequency. However, the minimization of the lateral modes does not necessarily mean increased $Q_p$ performance because the acoustic energy leaked to outside of the resonator may not be reduced. In fact, the $Q_p$ factor in an apodized resonator may be reduced because of apodization of the resonator. This is because the perimeter of an apodized resonator is greater than a square-edged or rectangular-edged resonator of same size, the loss of acoustic energy is actually slightly increased, indicating lower $Q_p$.

U.S. Pat. No. 7,280,007 entitled "Thin film bulk acoustic resonator with a mass loaded perimeter" discloses a technique to increase Qp through adding a raised frame to the resonator perimeter. The raised frame creates an acoustic impedance mismatch between the active area and outside area of the resonator such that acoustic energy of lateral modes is better confined in the active area. Additional mass can also be augmented either by adding more of the same material or by adding different materials with different mass density. Although the $Q_p$ is increased through the methods mentioned above, the $Kt^2_{eff}$ and the Q factor near series resonant frequency ($Q_s$) are reduced. This is not ideal in some applications where both the $Q_s$ and $Kt^2_{eff}$ should be maximized, for example, UMTS band 1 duplexer. Additionally, the spurious resonances below $f_s$ are enhanced by the raised frame. The spurious resonances cause a risk of generating strong ripples in the pass band of a filter.

Therefore, it is desirable to have a resonator structure with an enhanced $Q_p$ without compromising the $Kt^2_{eff}$, spurious modes and the $Q_s$. Hence, a heretofore unaddressed need exists in the art to address the aforementioned deficiencies and inadequacies.

SUMMARY OF THE INVENTION

In one aspect, the present invention relates to a piezoelectric resonator structure. In one embodiment, the piezoelectric resonator structure has: (i) a substrate, (ii) an acoustic mirror, (iii) a first electrode, (iv) a piezoelectric layer, and (v) a second electrode. Each of the substrate, the acoustic mirror, the first electrode, the piezoelectric layer and the second electrode has a top surface, a bottom surface, a first end portion, and an opposite, second end portion. The bottom surface of the acoustic mirror is placed on the top surface of the substrate. The bottom surface of the first electrode is placed on the top surface of the acoustic mirror. The bottom surface of the piezoelectric layer is placed on the top surface of the first electrode. The bottom surface of the second electrode is placed on the top surface of the piezoelectric layer. The overlapped area of body portions of the substrate, the acoustic mirror, the first electrode, the piezoelectric layer and the second electrode is defined as an active area A.

In one embodiment, the piezoelectric resonator structure also includes a first air gap in the first end portion of the piezoelectric layer and a second air gap in the second end portion of the piezoelectric layer.

In one embodiment, the piezoelectric resonator structure further includes a first interference structure extending from the first end portion of the second electrode, and a second interference structure extending from the second end portion of the second electrode, and these two interference structures are positioned on top of the first air gap and the second air gap, respectively.

In one embodiment, the piezoelectric resonator structure has an interference structure having a first end portion and a second end portion, positioned on the top surface of the second electrode. The width of the interference structure is greater than the width of the second electrode such that a first air gap is defined at the first end portion of the second electrode and a second air gap is defined at the second end portion of the second electrode, respectively. In another embodiment, the piezoelectric resonator structure has a first support to the interference structure, positioned between the first end portion of the interference structure and the top surface of the piezoelectric layer, and a second support to the interference structure, positioned between the second end portion of the interference structure and the top surface of the piezoelectric layer, such that a first air gap is formed between the first support and the first end portion of the second electrode and a second air gap is formed between the second support and the second end portion of the second electrode, respectively.

In one embodiment, the piezoelectric resonator structure has a first interference structure having a first end portion and a second end portion, positioned on the top surface of the second electrode with the second end portion at the first end portion of the second electrode and the first end portion suspended over the active area to form a first air gap, and a second interference structure having a first end portion and a second end portion, positioned on the top surface of the second electrode with the second end portion at the second end portion of the second electrode and the first end portion suspended over the active area to form a second air gap.

In one embodiment, the piezoelectric resonator structure has a first interference structure having a first end portion and a second end portion, positioned on the top surface of the second electrode with the second end portion at the first end portion of the second electrode and the first end portion suspended over the first end portion of the second electrode and the first end portion of the piezoelectric layer to form a first air gap, and a second interference structure having a first end portion and a second end portion, positioned on the top surface of the second electrode with the second end portion at the second end portion of the second electrode and the first end portion suspended over the second end portion of the second electrode and the second end portion of the piezoelectric layer to form a second air gap.

In one embodiment, the piezoelectric resonator structure has a first trapezoid interference structure having a first end portion and a second end portion, positioned on the top surface of the second electrode with the second end portion at the first end portion of the second electrode and the first end portion in the active area to form a first air gap, and a second trapezoid interference structure having a first end portion and a second end portion, positioned on the top surface of the second electrode with the second end portion at the second end portion of the second electrode and the first end portion in the active area to form a second air gap.

In one embodiment, the piezoelectric resonator structure has a first trapezoid interference structure having a first end portion and a second end portion, positioned such that the first end portion is placed on the top surface of the first end portion of the second electrode, and the second end portion is placed on the top surface of the first end portion of the piezoelectric layer so as to define a first air gap, and a second trapezoid interference structure having a first end portion and a second end portion, positioned such that the first end portion is placed on the top surface of the second end portion of the second electrode and the second end portion is placed on the top surface of the second end portion of the piezoelectric layer so as to define a second air gap.

In one embodiment, the piezoelectric resonator structure has an interference structure having a first arch interference structure at a first end portion of the interference structure and a second arch interference structure at a second end portion of the interference structure, positioned on the top surface of the second electrode with the first arch interference structure suspended over the top surface of the first end portion of the second electrode and the top surface of the first end portion of the piezoelectric layer to form a first air gap, and the second arch interference structure suspended over the top surface of the second end portion of the second electrode and the top surface of the second end portion of the piezoelectric layer to form a second air gap.

In one embodiment, the piezoelectric resonator structure has an interference structure having a first trapezoid interference structure at a first end portion of the interference structure and a second trapezoid interference structure at a second end portion of the interference structure. The interference structure is positioned on the top surface of the second electrode with the first trapezoid interference structure positioned on the top surface of the first end portion of the second electrode and the top surface of the first end portion of the piezoelectric layer to form a first air gap, and the second trapezoid interference structure positioned on the top surface of the second end portion of the second electrode and the top surface of the second end portion of the piezoelectric layer to form a second air gap.

In one embodiment, the first end portion of the second electrode of the piezoelectric resonator structure is made in an arch shape on the top surface of the piezoelectric layer to form a first air gap. The second end portion of the second electrode of the piezoelectric resonator structure is made in an arch shape on the top surface of the piezoelectric layer to form a second air gap.

In one embodiment, the first end portion of the second electrode of the piezoelectric resonator structure is made in a trapezoid shape on the top surface of the piezoelectric layer to form a first air gap, and the second end portion of the second electrode of the piezoelectric resonator structure is made in a trapezoid shape on the top surface of the piezoelectric layer to form a second air gap.

In one embodiment, the first end portion of the piezoelectric layer of the piezoelectric resonator structure is made in an arch shape on the top surface of the first electrode to form a first air gap, and the second end portion of the piezoelectric layer of the piezoelectric resonator structure is made in an arch shape on the top surface of the first electrode to form a second air gap.

In one embodiment, the top surface of the second electrode of the piezoelectric resonator structure is covered with a dielectric layer to form a multi-layered structure having a first end portion and a second end portion. The first end portion of the multi-layered structure is made in an arch shape on the top surface of the piezoelectric layer to form a first air gap, and the second end portion of the multi-layered structure is made in an arch shape on the top surface of the piezoelectric layer to form a second air gap.

In one embodiment, the top surface of the second electrode of the piezoelectric resonator structure is covered with a dielectric layer to form a multi-layered structure having a first end portion and a second end portion. The first end portion of the multi-layered structure is made in a trapezoid shape on the top surface of the piezoelectric layer to form a first air gap. The second end portion of the multi-layered structure is made in a trapezoid shape on the top surface of the piezoelectric layer to form a second air gap.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
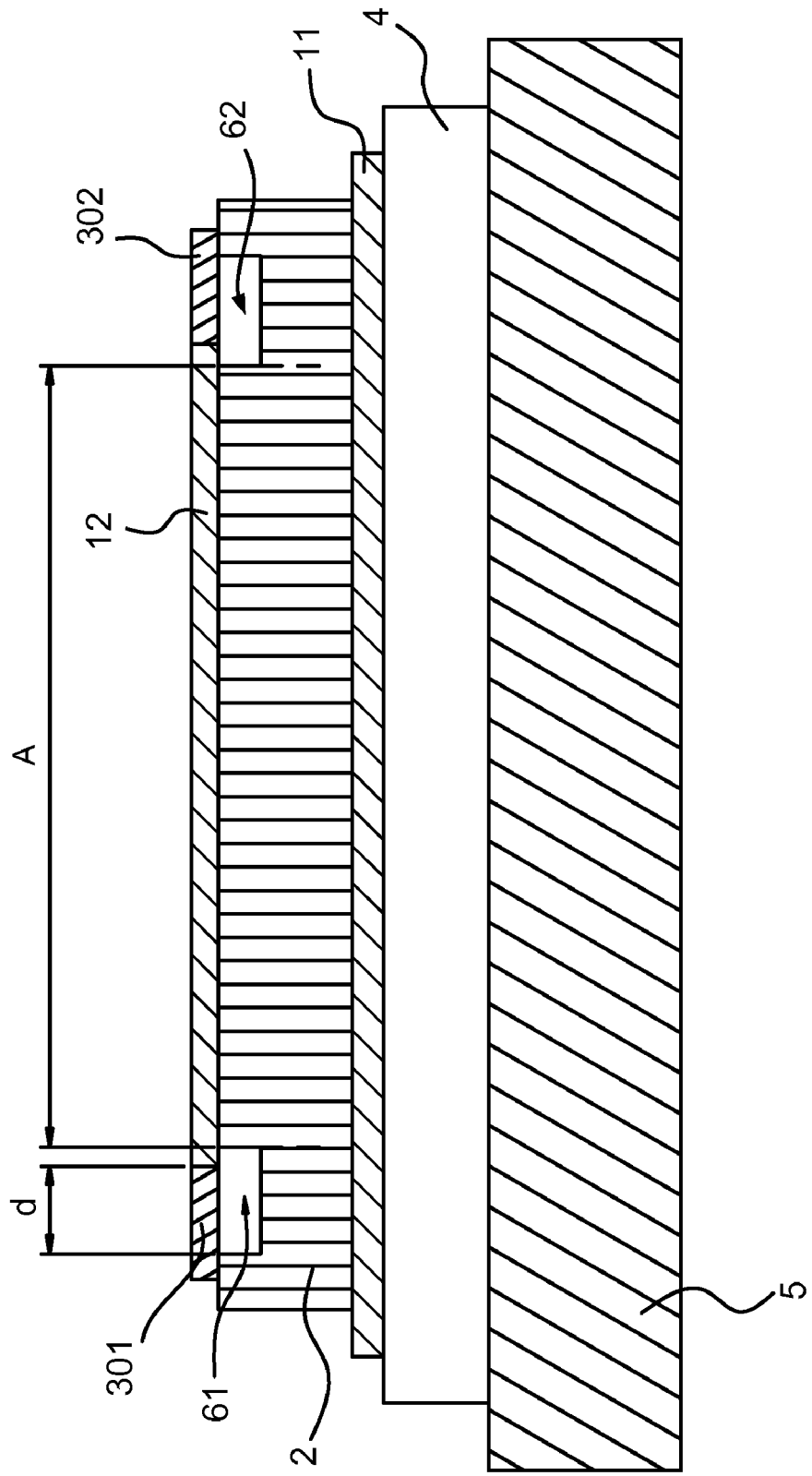
FIG. 1 shows a cross sectional view of a piezoelectric resonator structure with air gaps in the piezoelectric layer according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

The terms "film" and "layer", as used herein, are interchangeable and refer to a thin sheet of a material deposited or spread over a surface.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings of FIGS. 1-15. In accordance with the purposes of this invention, as embodied and broadly described herein, this invention, in one aspect, relates to a piezoelectric resonator structure.

In one embodiment, as shown in FIG. 1, the piezoelectric resonator structure has: (i) a substrate 5, (ii) an acoustic mirror 4, (iii) a first electrode 11, (iv) a piezoelectric layer 2, and (v) a second electrode 12. Each of the substrate 5, the acoustic mirror 4, the first electrode 11, the piezoelectric layer 2 and the second electrode 12 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The overlapped area of body portions of the substrate 5, the acoustic mirror 4, the first electrode 11, the piezoelectric layer 2 and the second electrode 12 is defined as an active area A, which has a first acoustic impedance.

The acoustic mirror 4 can be an air layer or a laminated acoustic wave reflection mirror. The embodiment provides features as follow: a first interference structure 301 is extended from the first end portion of the second electrode 12 and a second interference structure 302 is extended from the second end portion of the second electrode 12. A first air gap 61 is formed between the first interference structure 301 and the first end portion of the piezoelectric layer 2, and a second air gap 62 is formed between the second interference structure 302 and the second end portion of the piezoelectric layer 2. At least a portion of the first interference structure 301 and second interference structure 302 are suspended above the first air gap 61 and the second air gap 62 without in contact therewith, respectively. Hence a two-degree of freedom vibration can be generated to allow the first and the second interference structure 301 and 302 suspended above the first air gap 61 and the second air gap 62 to form a second acoustic impedance different from first acoustic impendence of the active area A.

The first interference structure 301 and the second interference structure 302 are connected with the active area A to form a boundary of mismatch impedance. The first interference structure 301 and the second interference structure 302 are arranged to surround the active area A. With the second acoustic impedance of the first interference structure 301 and the second interference structure 302 and the first acoustic impedance mismatched, a discontinued acoustic boundary is created and the first interference structure 301 and the second interference structure 302 interfere with the acoustic propagation of lateral mode previously discussed. Hence a portion of acoustic wave energy of the lateral modes is decoupled and reflected into the active area A and transformed to a desirable piston mode perpendicular to the plane of the piezoelectric layer 2. The dimension of the interference structure is carefully selected such that reflection coefficient for lateral mode acoustic waves reflecting off of the edges and transformation from lateral mode acoustic waves to piston acoustic wave mode are maximized, thus improving $Q_p$. Since the first interference structure 301 and the second interference structure 302 do not change the mechanical displacement distribution of active area in the direction of the applied electric field, it doesn't degrade $Q_s$ of the resonator and has no effect on strength of spurious resonance modes. The first interference structure 301 and the second interference structure 302 and the second electrode 12 can be made of the same or different conductive materials. In the event that the first interference structure 301 and the second interference structure 302 are made of a dielectric or non-conductive material, in order to generate the acoustic waves (especially the lateral resonant waves) to produce interaction with the first interference structure 301 and the second interference structure 302, the junction of distal ends of the first interference structure 301 and the second interference structure 302 and the second electrode 12 is preferably positioned above or close to the first air gap 61 and the second air gap 62, respectively. In this embodiment, a portion of the length d of the first interference structure 301 is suspended over the first air gap 61 and a similar structure is also formed on the second end portion of the active area A. The length d is smaller than the length of the first air gap 61, and the length of the second electrode 12 is longer than the width of the overlapped active area A, such that the first air gap 61 and the second air gap 62 are fully covered by the second electrode 12 and the first interference structure 301 and the second interference structure 302, respectively.

Figure 2:
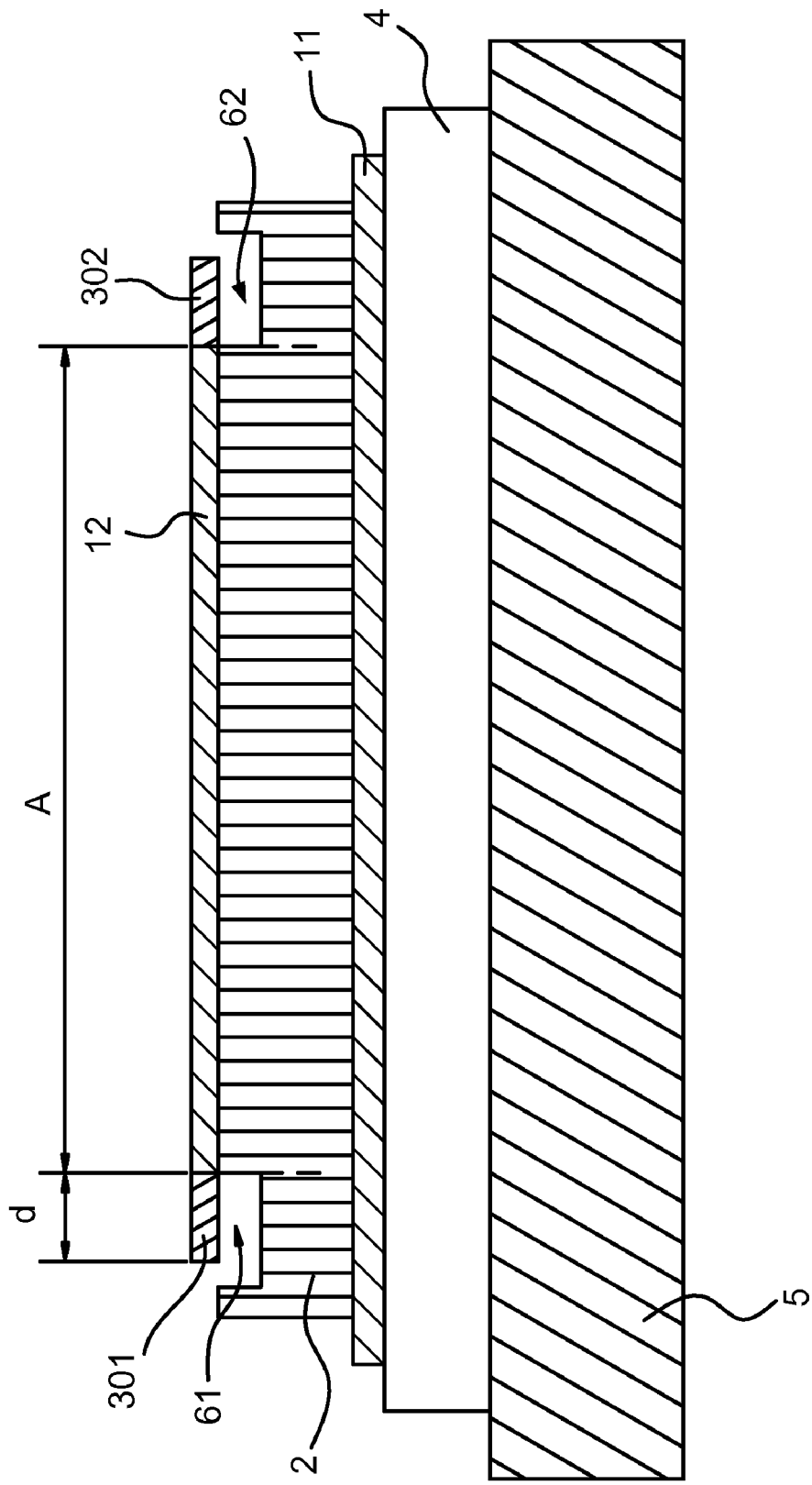
FIG. 2 shows a cross sectional view of a piezoelectric resonator structure with air gaps in the piezoelectric layer according to another embodiment of the present invention.

In another embodiment, as shown in FIG. 2, the piezoelectric resonator structure has a similar structure as the embodiment shown in FIG. 1. The difference is that the first air gap 61 and the second air gap 62 are not fully covered by the second electrode 12 and the first interference structure 301 and the second interference structure 302, respectively. The length d of the first interference structure 301 and the second interference structure 302 are shortened such that the first interference structure 301 and the second interference structure 302 become cantilevers suspended over the first air gap 61 and the second air gap 62, respectively. Additionally, the length d may be altered to change the amount of reflection acoustic energy.

Figure 3:
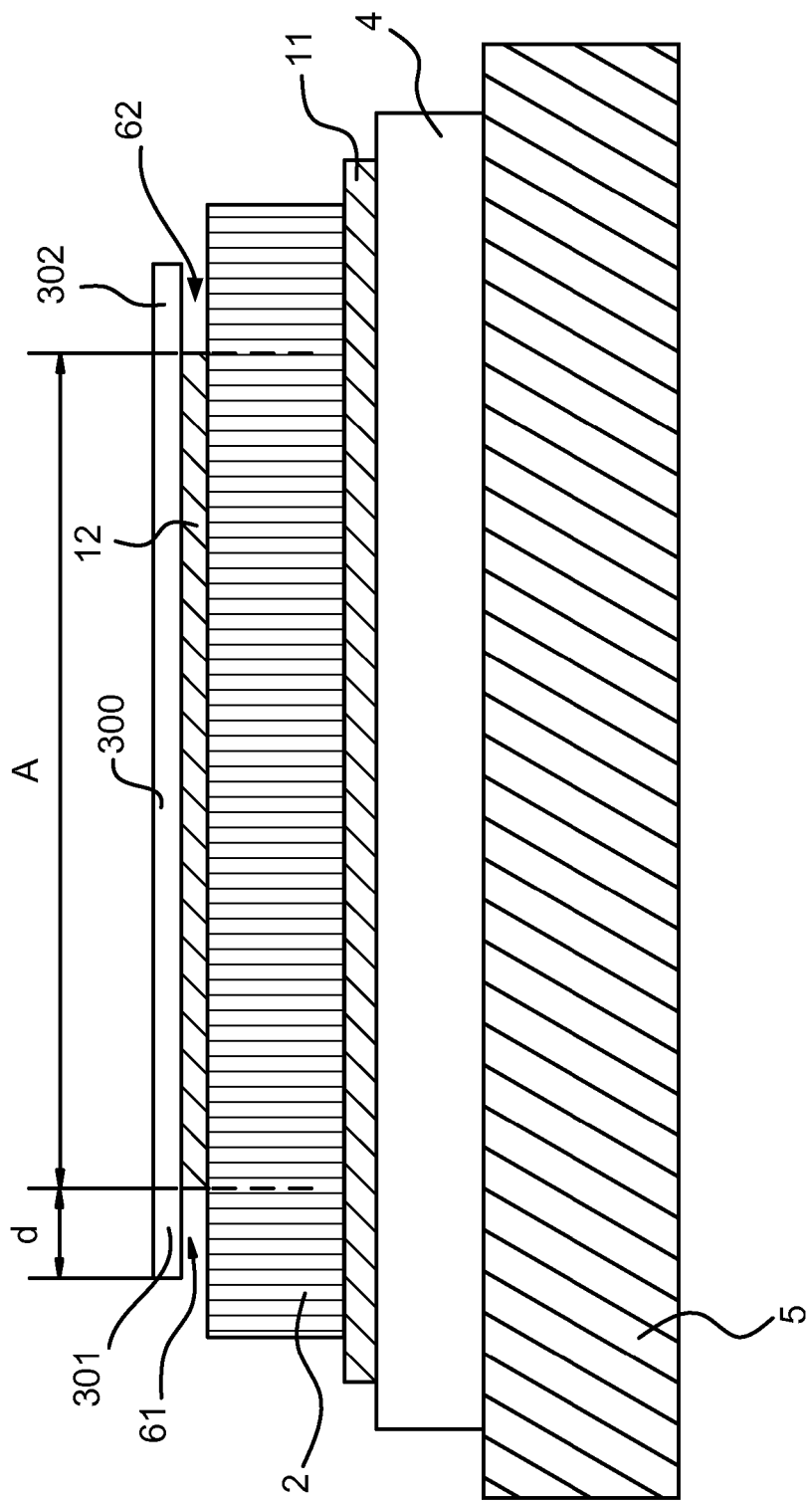
FIG. 3 shows a cross sectional view of a piezoelectric resonator structure with an interference structure layer according to one embodiment of the present invention.

In one embodiment, as shown in FIG. 3, the piezoelectric resonator structure has: (i) a substrate 5, (ii) an acoustic mirror 4, (iii) a first electrode 11, (iv) a piezoelectric layer 2, (v) a second electrode 12 and (vi) an interference structure 300. Each of the substrate 5, the acoustic mirror 4, the first electrode 11, the piezoelectric layer 2, the second electrode 12 and the interference structure 300 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The bottom surface of the interference structure 300 having a first end portion 301 and a second end portion 302 is placed on the top surface of the second electrode 12. The overlapped area of body portions of the substrate 5, the acoustic mirror 4, the first electrode 11, the piezoelectric layer 2, the second electrode 12 and the interference structure 300 is defined as an active area A, which has a first acoustic impedance.

The width of the interference structure 300 is larger than the width of the second electrode 12 so that the first end portion 301 of the interference structure 300 form a first air gap 61 between the bottom surface of the first end portion 301 of the interference structure 300 and the top surface of the first end portion of the piezoelectric layer 2, and the second end portion 302 of the interference structure 300 form a second air gap 62 between the bottom surface of the second end portion 302 of the interference structure 300 and the top surface of the second end portion of the piezoelectric layer 2, respectively. Reflection acoustic energy and corresponding $Q_p$ can be changed by varying the excessive length d of the interference structure 300 over the second electrode 12.

Figure 4:
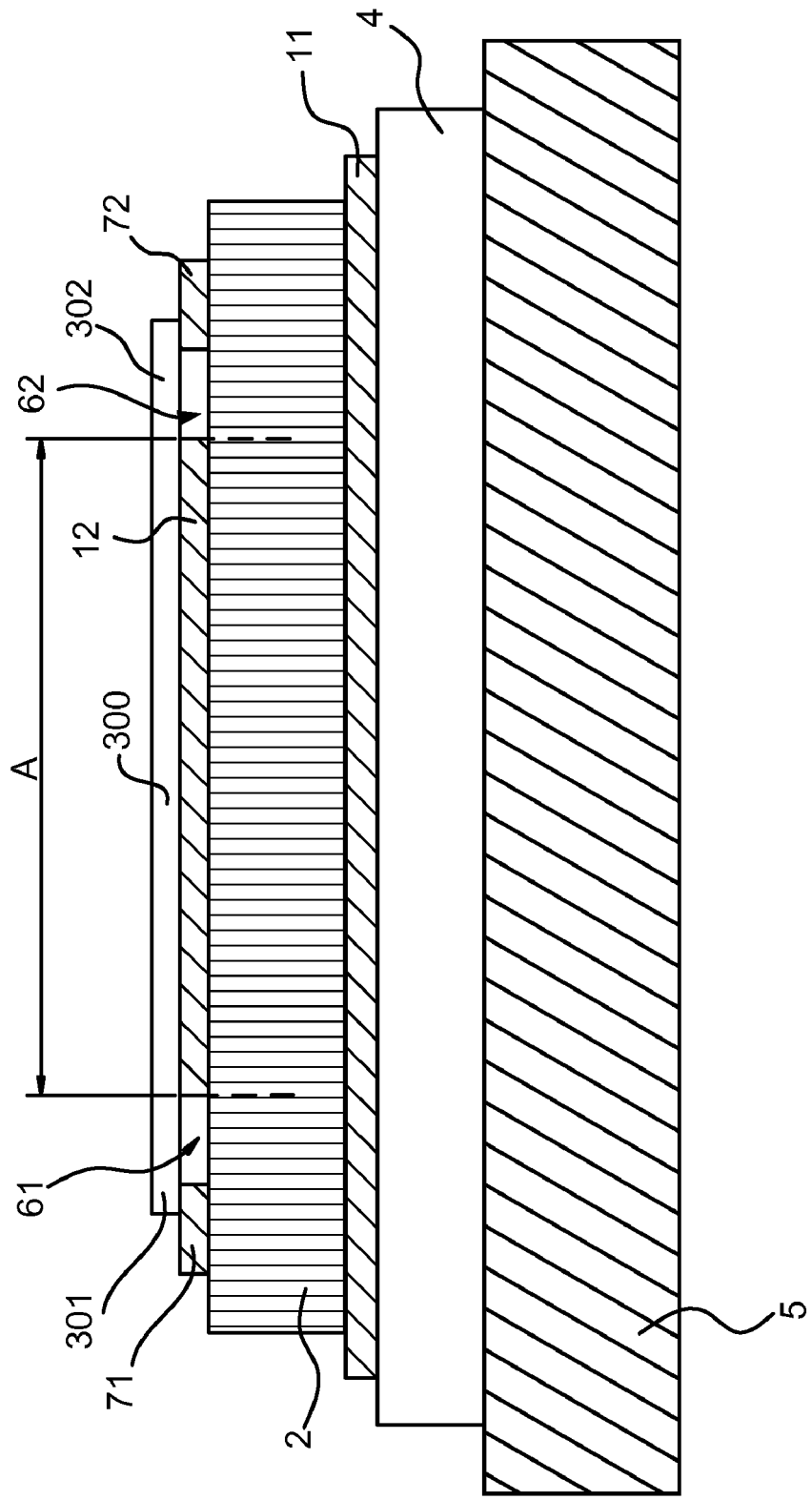
FIG. 4 shows a cross sectional view of a piezoelectric resonator structure with an interference structure layer and supporting structure according to one embodiment of the present invention.

In one embodiment, FIG. 4 shows a cross sectional view of a piezoelectric resonator structure with an interference structure layer and supporting structure according to one embodiment of the present invention. The piezoelectric resonator structure has a similar structure as the embodiment shown in FIG. 3. The difference is that in order to enhance the physical strength of the interference structure 300, a first supporting structure 71 and a second supporting structure 72 are placed under the tips of the first end portion 301 and the second end portion 302 of the interference structure 300 to form a first air gap 61 and a second air gap 62, respectively. The first supporting structure 71 and the second supporting structure 72 can be made of conductive material or non-conductive material. There is no electric connectivity between the supporting structures 71 and 72 and the second electrode 12.

Figure 5:
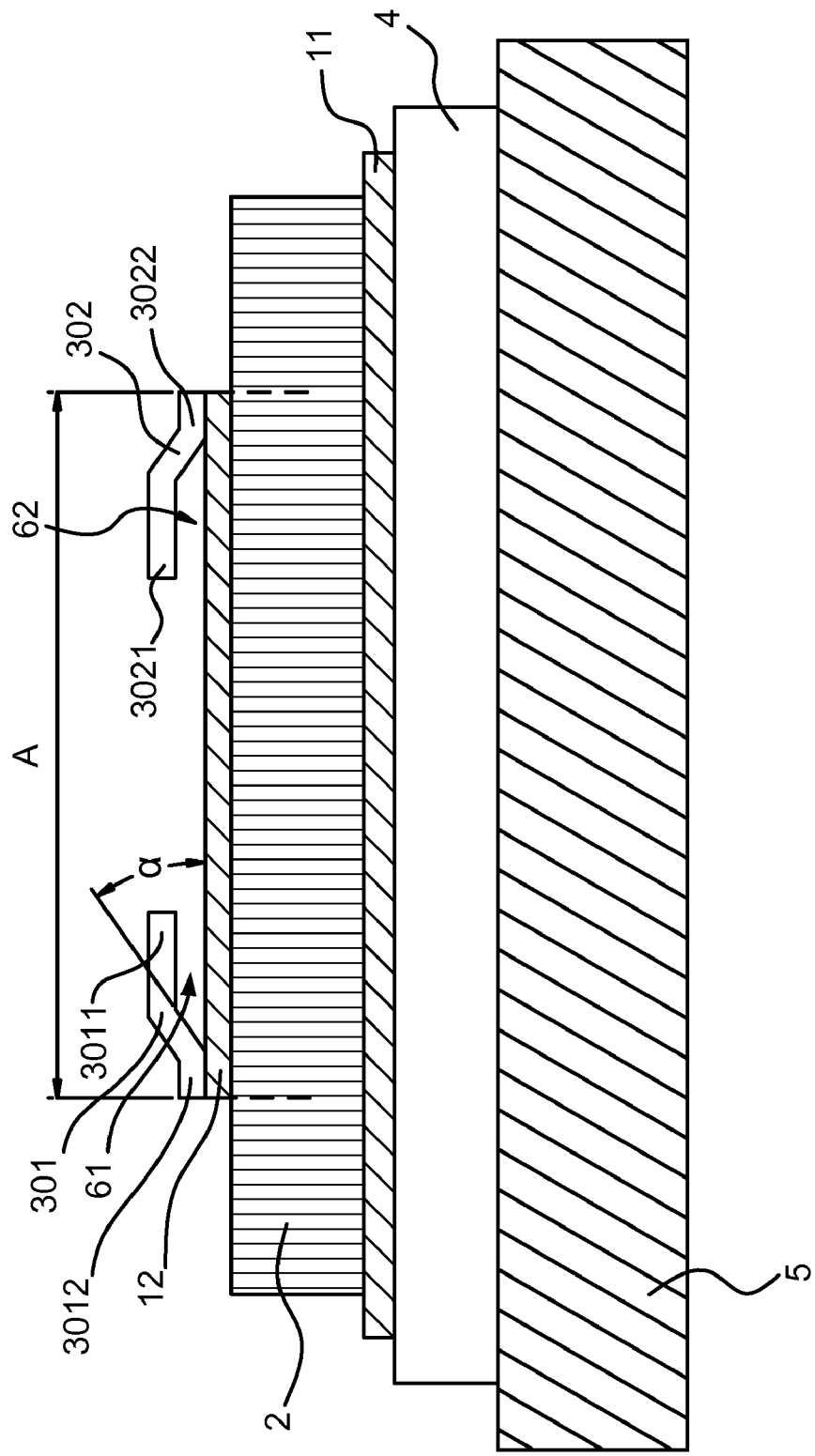
FIG. 5 shows a cross sectional view of a piezoelectric resonator structure with a pair of arch-shaped interference structures suspending over the active area according to one embodiment of the present invention.

Referring now to FIG. 5, a cross sectional view of a piezoelectric resonator structure with a pair of arch-shaped interference structures suspending over the active area is shown according to one embodiment of the present invention. The piezoelectric resonator structure has: (i) a substrate 5, (ii) an acoustic mirror 4, (iii) a first electrode 11, (iv) a piezoelectric layer 2, (v) a second electrode 12 and (vi) a first interference structure 301 on the top surface of the first end portion of the second electrode 12 and a second interference structure 302 on the top surface of the second end portion of the second electrode 12. Each of the substrate 5, the acoustic mirror 4, the first electrode 11, the piezoelectric layer 2, and the second electrode 12 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The overlapped area of body portions of the substrate 5, the acoustic mirror 4, the first electrode 11, the piezoelectric layer 2, and the second electrode 12 is defined as an active area A, which has a first acoustic impedance. The bottom surface of the first interference structure 301 having a first end portion 3011 and a second end portion 3012 is placed on the top surface of the first end portion of the second electrode 12 and the second interference structure 302 having a first end portion 3021 and a second end portion 3022 is placed on the top surface of the second end portion of the second electrode 12.

The first interference structure 301 and the second interference structure 302 are of cantilever shape with a first end portion 3011 of the first interference structure 301 and the first end portion 3021 of the second interference structure 302 suspended over the active area A and a second end portion 3012 of the first interference structure 301 and the second end portion 3022 of the second interference structure 302 are connected to the top surface of the second electrode 12 at the first end portion of the second electrode 12 and the second end portion of the second electrode 12, respectively. The first interference structure 301 and the second interference structure 302 and second electrode 12 can be made of the same or different materials. The second end portion 3012 of the first interference structure 301 and the second end portion 3022 of the second interference structure 302 support the first end portion 3011 of the first interference structure 301 and the first end portion 3021 of the second interference structure 302 in a suspending manner over the active area A of the piezoelectric resonator to form a first air gap 61 and a second air gap 62 above the top surface of the second electrode 12, respectively. The first interference structure 301 and the second interference structure 302 are formed by bending the material into three sections with the first end portion 3011 or 3021 and the second end portion 3012 or 3022 parallel to the top surface of the second electrode 12 and the mid-section is bent to form an angle of $\alpha$ against the top surface of the second electrode 12. A mismatched second impedance value can be changed by varying the angle $\alpha$ and overall dimension (such as width and thickness) of the first interference structure 301 and the second interference structure 302.

Figure 6:
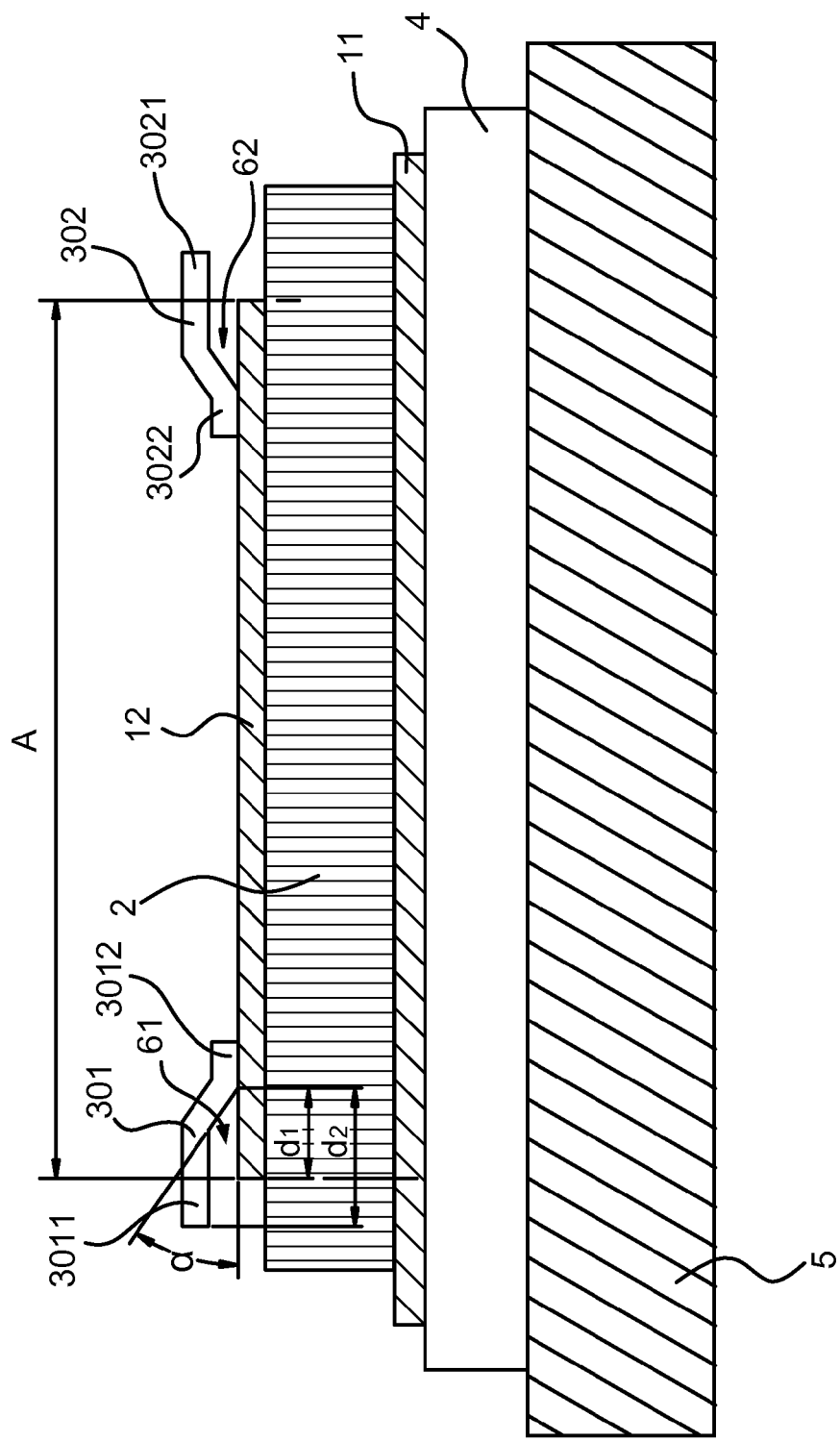
FIG. 6 shows a cross sectional view of a piezoelectric resonator structure with a pair of arch-shaped interference structures suspending over both end portions of the second electrode according to one embodiment of the present invention.

Referring now to FIG. 6, a cross sectional view of a piezoelectric resonator structure with a pair of arch-shaped interference structures suspending over both end portions of the second electrode is shown according to one embodiment of the present invention. The piezoelectric resonator structure has a similar structure as the embodiment shown in FIG. 5. The difference is that the first end portion 3011 of the first interference structure 301 and the first end portion 3021 of the second interference structure 302 are reversed comparing to the embodiment in FIG. 5.

The first interference structure 301 and the second interference structure 302 are of cantilever shape with a first end portion 3011 of the first interference structure 301 and a first end portion 3021 of the second interference structure 302 suspended over space between the top surface of the first end portion of the piezoelectric layer 2 and the first end portion of the second electrode 12, and the top surface of the second end portion of the piezoelectric layer 2 and the second end portion of the second electrode 12, respectively. A second end portion 3012 of the first interference structure 301 and the second end portion 3022 of the second interference structure 302 are connected to the top surface of the second electrode 12 at the first end portion of the second electrode 12 and the second end portion of the second electrode 12, respectively. The first interference structure 301 and the second interference structure 302 and second electrode 12 can be made of the same or different materials. The second end portion 3012 of the first interference structure 301 and the second end portion 3022 of the second interference structure 302 support the first end portion 3011 of the first interference structure 301 and the first end portion 3021 of the second interference structure 302 in a suspending manner over the space between the top surface of the piezoelectric layer 2 and the first end portion of the second electrode 12 and the top surface of the piezoelectric layer 2 and the second end portion of the second electrode 12 of the piezoelectric resonator to form a first air gap 61 and a second air gap 62, respectively.

The first interference structure 301 and the second interference structure 302 are formed by bending the material into three sections with the first end portion 3011 or 3021 and the second end portion 3012 or 3022 parallel to the top surface of the second electrode 12 and the mid-section is bent to form an angle of α against the top surface of the second electrode 12. The length of the first end portion of the second electrode 12 beyond the connection point between the second end portion 3012 of the first interference structure 301 and the first end portion of the second electrode 12 is defined as d1, and the length of the first interference structure 301 beyond the connection point between the second end portion 3012 of the first interference structure 301 and the first end portion of the second electrode 12 is defined as d2. The lengths d1 and d2 affect the intrinsic vibration frequency of the first interference structure 301 and the second interference structure 302. Alteration of the angle α and the length parameters d1 and d2 of the first interference structure 301 and the second interference structure 302 directly affects the second acoustic impedance value and impacts the amount of acoustic energy reflected into the active area by the first interference structure 301 and the second interference structure 302 in the piezoelectric resonator.

Figure 7:
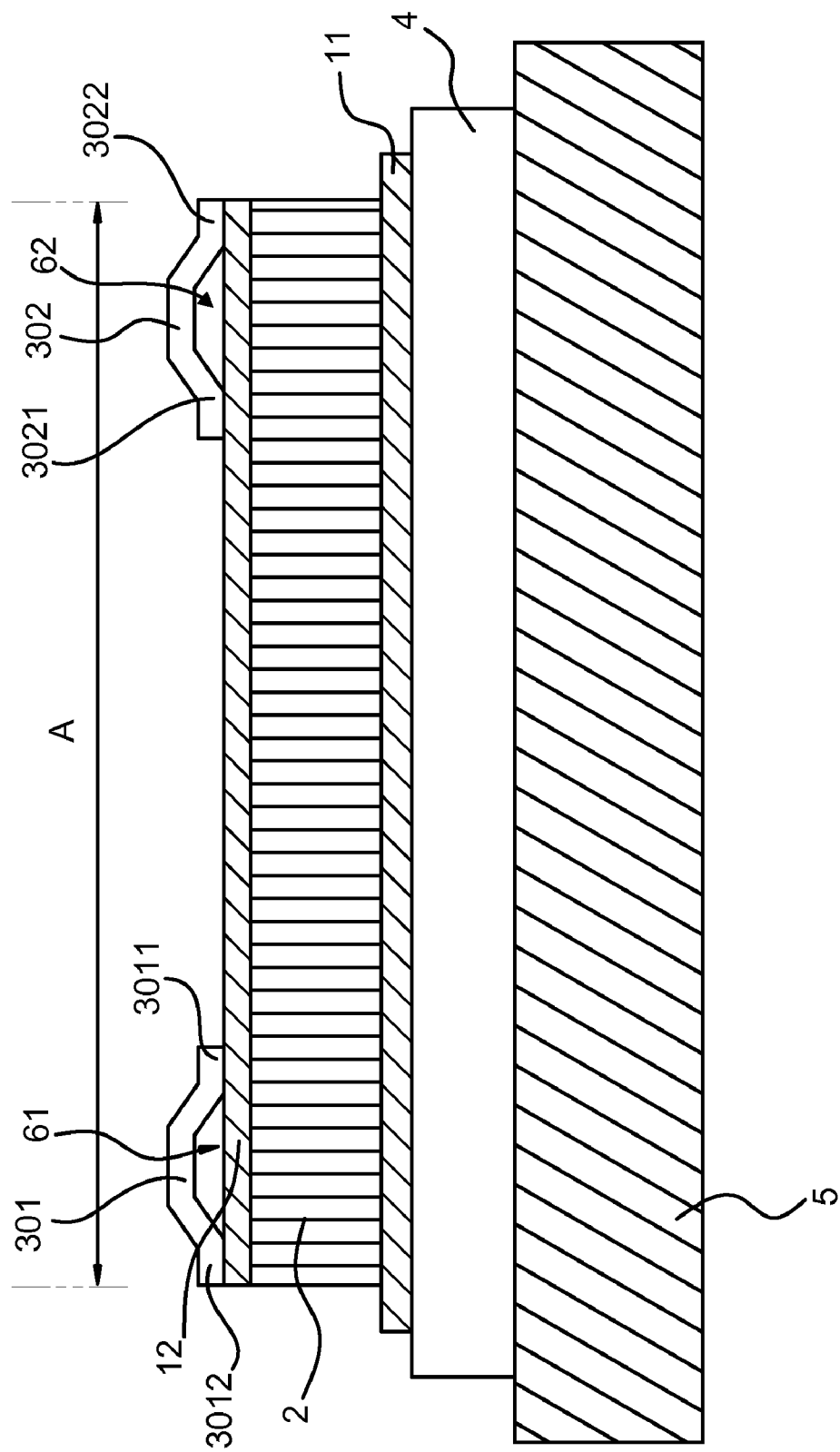
FIG. 7 shows a cross sectional view of a piezoelectric resonator structure with a pair of trapezoid-shaped interference structures on the top surface of both end portions of the second electrode according to one embodiment of the present invention.

Referring now to FIG. 7, a cross sectional view of a piezoelectric resonator structure with a pair of trapezoid-shaped interference structures on the top surface of both end portions of the second electrode is shown according to one embodiment of the present invention. The piezoelectric resonator structure has: (i) a substrate 5, (ii) an acoustic mirror 4, (iii) a first electrode 11, (iv) a piezoelectric layer 2, (v) a second electrode 12 and (vi) a first interference structure 301 and a second interference structure 302. Each of the substrate 5, the acoustic mirror 4, the first electrode 11, the piezoelectric layer 2, and the second electrode 12 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The overlapped area of body portions of the substrate 5, the acoustic mirror 4, the first electrode 11, the piezoelectric layer 2, and the second electrode 12 is defined as an active area A, which has a first acoustic impedance. The bottom surface of the first interference structure 301 having a first end portion 3011 and a second end portion 3012 and the second interference structure 302 having a first end portion 3021 and a second end portion 3022 are placed on the top surface of the second electrode 12.

The first interference structure 301 and the second interference structure 302 are of trapezoid shape with the first end portion 3011 and the second end portion 3012 of the first interference structure 301 and the first end portion 3021 and the second end portion 3022 of the second interference structure 302 connected to the top surface of the second electrode 12 within the active area A, respectively. The first interference structure 301 and the second interference structure 302 and second electrode 12 can be made of the same or different materials. A first air gap 61 is formed under the first interference structure 301 and above the top surface of the second electrode 12 and a second air gap 62 is formed under the second interference structure 302 and above the top surface of the second electrode 12, respectively. The first interference structure 301 and the second interference structure 302 are formed by bending the material into five sections in a trapezoid shape with the first end portion 3011 and the second end portion 3012 of the first interference structure 301, the first end portion 3021 and the second end portion 3022 of the second interference structure 302, and mid-section of the trapezoid shape parallel to the top surface of the second electrode 12. The other two sides form a symmetric angle against the top surface of the second electrode 12.

Figure 8:
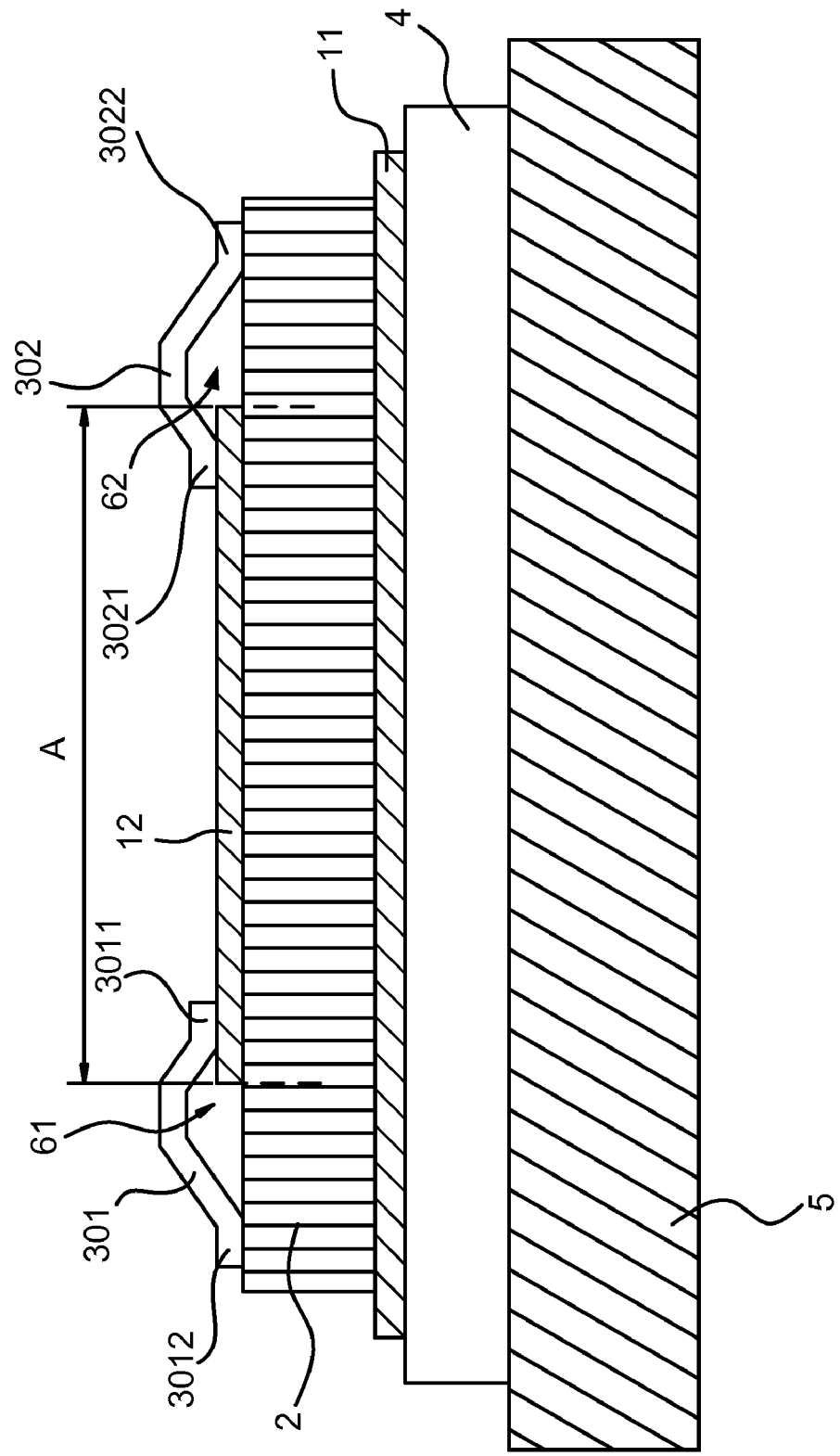
FIG. 8 shows a cross sectional view of a piezoelectric resonator structure with a pair of trapezoid-shaped interference structures on the top surface of both end portions of the second electrode and both end portions of the piezoelectric layer according to one embodiment of the present invention.

Referring now to FIG. 8, a cross sectional view of a piezoelectric resonator structure with a pair of trapezoid-shaped interference structures on the top surface of both end portions of the second electrode and both end portions of the piezoelectric layer according to one embodiment of the present invention. The piezoelectric resonator structure has a similar structure as the embodiment shown in FIG. 7. The difference is that the both ends of the first and second interference structure are placed on different surfaces rather than the same top surface of the second electrode 12.

The first interference structure 301 and the second interference structure 302 are of trapezoid shapes. The first end portion 3011 of the first interference structure 301 is placed on the top surface of the first end portion of the second electrode 12. The second end portion 3012 of the first interference structure 301 is placed on the top surface of first end portion of the piezoelectric layer 2. The first end portion 3021 of the second interference structure 302 is placed on the top surface of the second end portion of the second electrode 12. The second end portion 3022 of the second interference structure 302 is placed on the top surface of second end portion of the piezoelectric layer 2, respectively.

The first end portion 3011 of the first interference structure 301 is connected to the first end portion of the top surface of the second electrode 12 and the first end portion 3021 of the second interference structure 302 is connected to the second end portion of the top surface of the second electrode 12, and the second end portion 3012 of the first interference structure 301 is connected to the first end portion of the top surface of the piezoelectric layer 2, and the second end portion 3022 of the second interference structure 302 is connected to the second end portion of the top surface of the piezoelectric layer 2, respectively.

The first interference structure 301 and the second interference structure 302 are formed by bending the material into five sections in a trapezoid shape with the first end portion 3011 and the second end portion 3012 of the first interference structure 301, the first end portion 3021 and the second end portion 3022 of the second interference structure 302, and mid-section of the trapezoid shape parallel to the top surface of the second electrode 12. The other two sides form an asymmetric angle against the top surface of the second electrode 12. A first air gap 61 is formed between the first interference structure 301, the first end portion of the piezoelectric layer 2 and the first end portion of the second electrode 12, and a second air gap 62 is formed between the second interference structure 302, the second end portion of the piezoelectric layer 2 and the second end portion of the second electrode 12, respectively.

Figure 9:
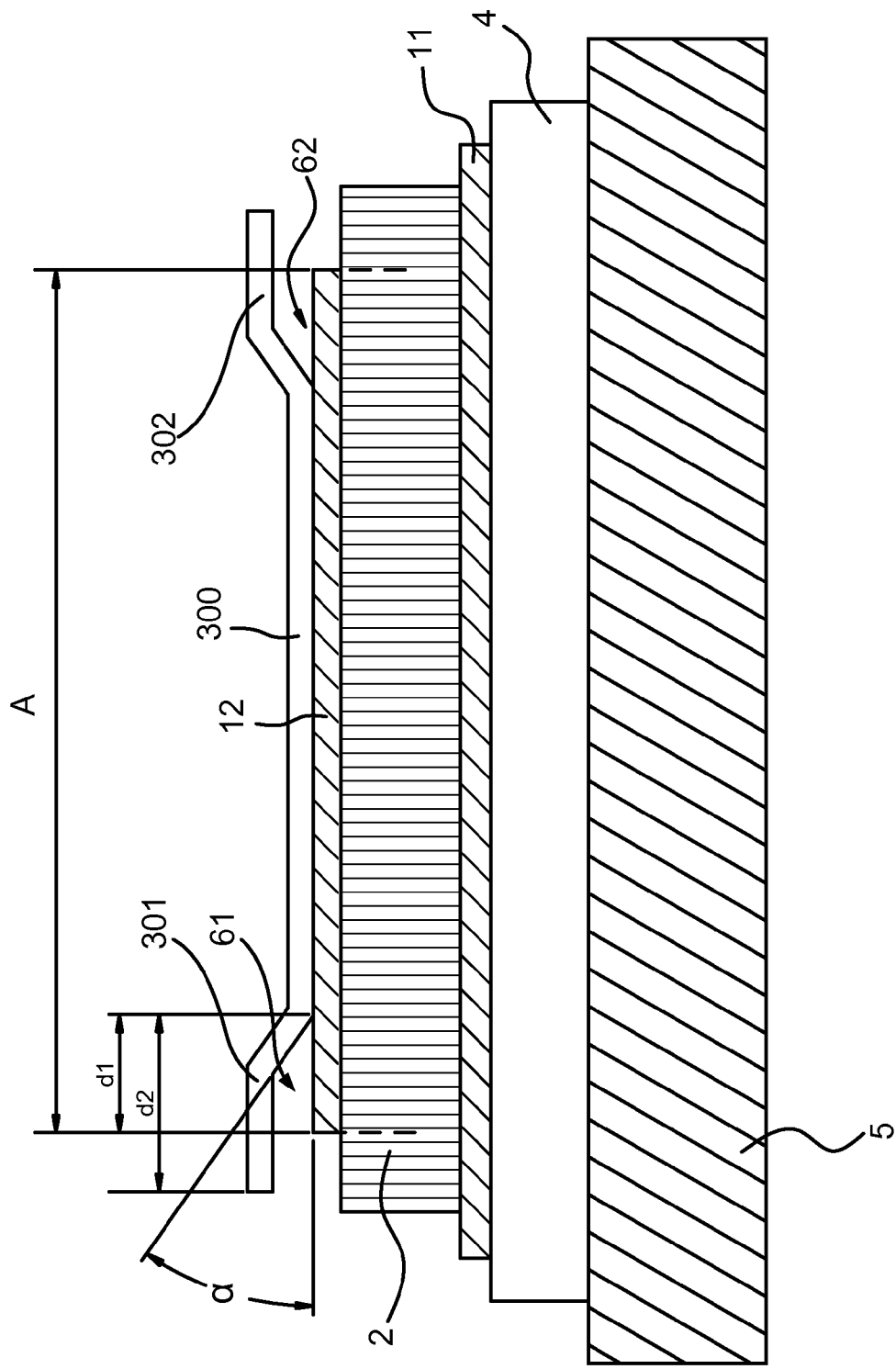
FIG. 9 shows a cross sectional view of a piezoelectric resonator structure with a pair of arch-shaped dielectric interference structures on the top surface of both end portions of the second electrode and both end portions of the piezoelectric layer according to one embodiment of the present invention.

In one embodiment, as shown in FIG. 9, the piezoelectric resonator structure has: (i) a substrate 5, (ii) an acoustic mirror 4, (iii) a first electrode 11, (iv) a piezoelectric layer 2, (v) a second electrode 12 and (vi) an interference structure 300. Each of the substrate 5, the acoustic mirror 4, the first electrode 11, the piezoelectric layer 2, the second electrode 12 and the interference structure 300 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The bottom surface of the interference structure 300 having a first end portion 301 and a second end portion 302 is placed on the top surface of the second electrode 12. The overlapped area of body portions of the substrate 5, the acoustic mirror 4, the first electrode 11, the piezoelectric layer 2 and the second electrode 12 is defined as an active area A, which has a first acoustic impedance.

The width of the interference structure 300 is larger than the width of the second electrode 12. The first end portion 301 of the interference structure 300 is bent upward in a predetermined angle α and then bent again to form the first end portion 301 of the interference structure 300 that is parallel to the top surface of the first end portion of the second electrode 12 and the top surface of the first end portion of the piezoelectric layer 2. The second end portion 302 of the interference structure 300 is bent upward in a predetermined angle α and then bent again to form the second end portion 302 of the interference structure 300 that is parallel to the top surface of the second end portion of the second electrode 12 and the top surface of the second end portion of the piezoelectric layer 2. A first air gap 61 is formed between the first end portion 301 of the interference structure 300, the first end portion of the piezoelectric layer 2 and the first end portion of the second electrode 12, and a second air gap 62 is formed between the second end portion 302 of the interference structure 300, the second end portion of the piezoelectric layer 2 and the second end portion of the second electrode 12, respectively.

The interference structure 300 can be made of dielectric material. The dielectric interference structure 300 can also serve as a passivation layer of the piezoelectric resonator structure. The distance from the connection end of the first end portion 301 of the interference structure 300 to the first end portion of the second electrode 12 is defined as d1, and the distance from the connection end of the first end portion 301 of the interference structure 300 to the end of the first interference structure 301 is defined as d2. Alteration of the length and angle parameters of the first end portion 301 and the second end portion 302 of the interference structure 300 also directly affects the amount of reflection acoustic energy by the interference structure 300 and the $Q_p$ factor of the resonator.

Figure 10:
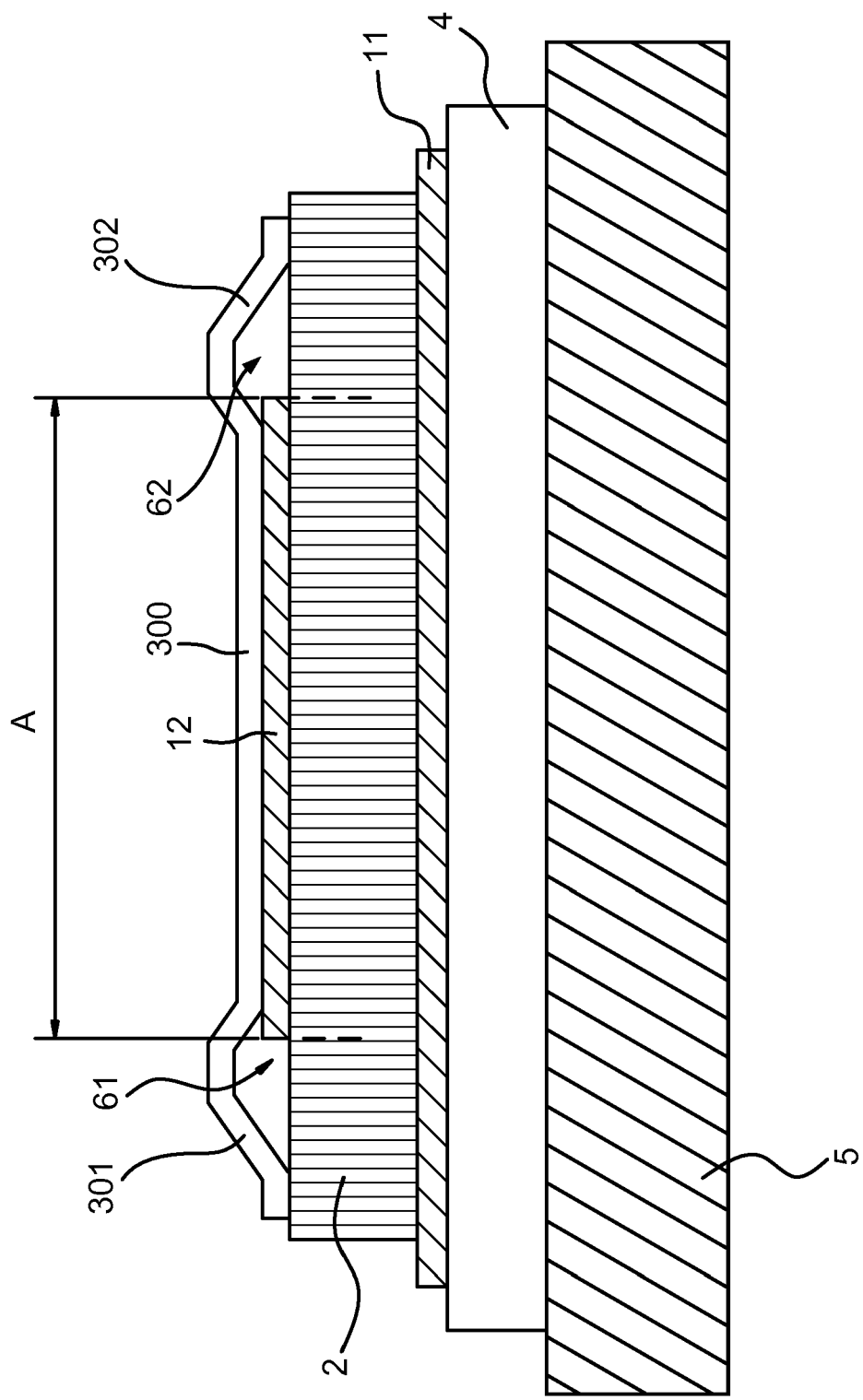
FIG. 10 shows a cross sectional view of a piezoelectric resonator structure with a pair of trapezoid-shaped dielectric interference structures on the top surface of both end portions of the second electrode and both end portions of the piezoelectric layer according to one embodiment of the present invention.

Referring now to FIG. 10, a cross sectional view of a piezoelectric resonator structure with a pair of trapezoid-shaped dielectric interference structures on the top surface of both end portions of the second electrode and both end portions of the piezoelectric layer is shown according to one embodiment of the present invention. The piezoelectric resonator structure has a similar structure as the embodiment shown in FIG. 9. The difference is that the first end portion 301 of the interference structure 300 and the second end portion 302 of the interference structure 300 are further bend down to form a trapezoid shape with the first end portion 301 and the second end portion 302 of the interference structure 300 connected to the top surface of the first end portion of the piezoelectric layer 2 and the top surface of the second end portion of the piezoelectric layer 2, respectively.

A first air gap 61 is formed between the first interference structure 301, the first end portion of the piezoelectric layer 2 and the first end portion of the second electrode 12, and a second air gap 62 is formed between the second end portion 302 of the interference structure 300, the second end portion of the piezoelectric layer 2 and the second end portion of the second electrode 12, respectively.

Figure 11:
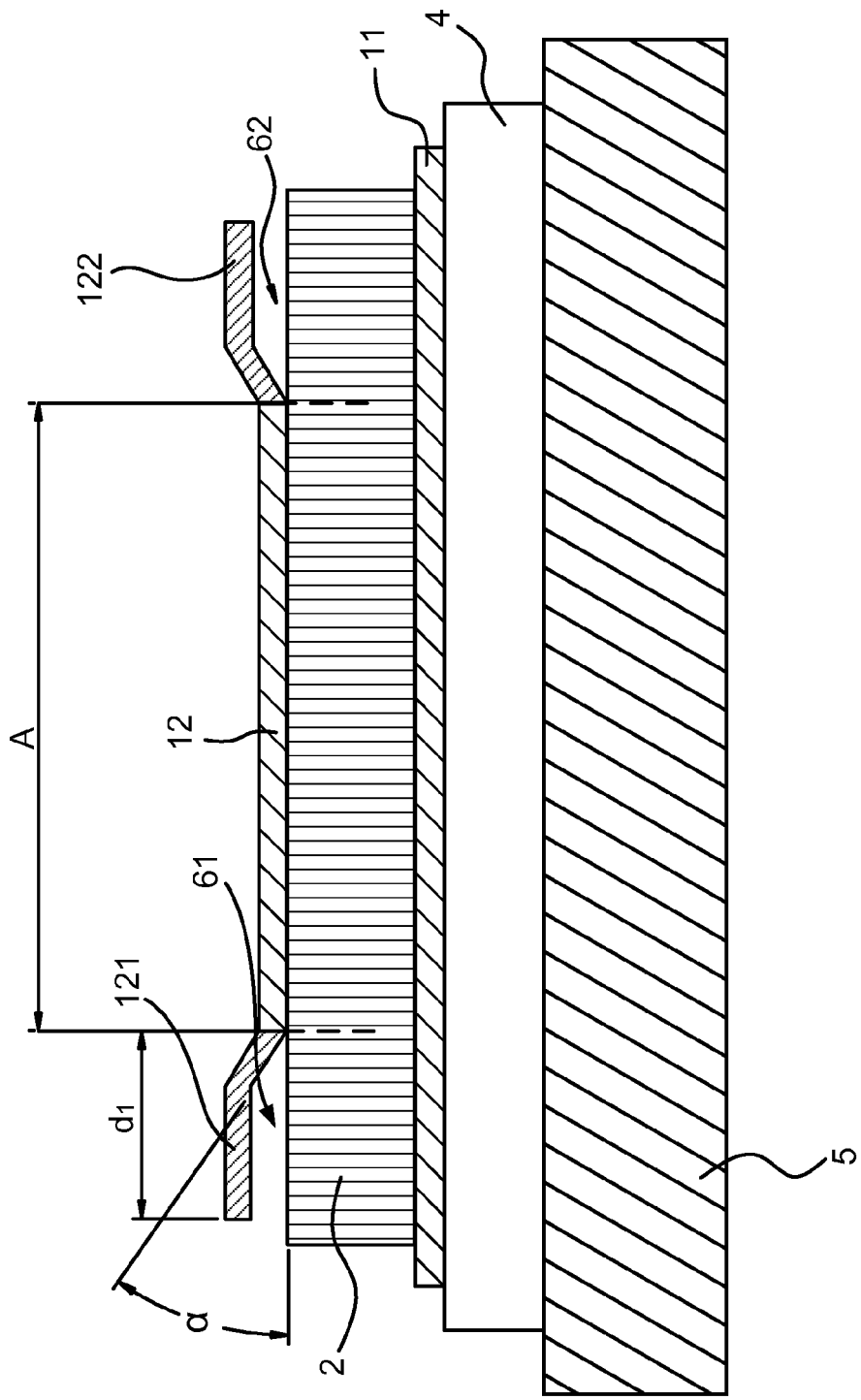
FIG. 11 shows a cross sectional view of a piezoelectric resonator structure with a pair of arch-shaped interference structures on both end portions of the second electrode over the top surface of the piezoelectric layer according to one embodiment of the present invention.

Referring now to FIG. 11, a cross sectional view of a piezoelectric resonator structure with a pair of arch-shaped interference structure on both end portions of the second electrode over the top surface of the piezoelectric layer is shown according to one embodiment of the present invention. The piezoelectric resonator structure has: (i) a substrate 5, (ii) an acoustic mirror 4, (iii) a first electrode 11, (iv) a piezoelectric layer 2, and (v) a second electrode 12. Each of the substrate 5, the acoustic mirror 4, the first electrode 11, the piezoelectric layer 2 and the second electrode 12 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The overlapped area of body portions of the substrate 5, the acoustic mirror 4, the first electrode 11, the piezoelectric layer 2 and the second electrode 12 is defined as an active area A, which has a first acoustic impedance.

The acoustic mirror 4 can be an air layer or a laminated acoustic wave reflection mirror. The embodiment provides features as follow: a first arch-shaped interference structure 121 is formed at the first end portion of the second electrode 12 over the first end portion of the piezoelectric layer 2 and a second arch-shaped interference structure 122 is formed at the second end portion of the second electrode 12 over the second end portion of the piezoelectric layer 2. A first air gap 61 is formed between the bottom surface of the first interference structure 121 and the top surface of the first end portion of the piezoelectric layer 2, and a second air gap 62 is formed between the bottom surface of the second interference structure 122 and the top surface of the second end portion of the piezoelectric layer 2, respectively. The first interference structure 121 and the second interference structure 122 are suspended above the first air gap 61 and the second air gap 62 without in contact therewith, respectively. Hence a two-degree of freedom vibration can be generated to allow the first and the second interference structure 121 and 122 suspended above the first air gap 61 and the second air gap 62 to form a second acoustic impedance different from the first acoustic impendence of the active area A.

The first interference structure 121 and the second interference structure 122 are connected with the active area A to form a boundary of mismatch impedance. The first interference structure 121 and the second interference structure 122 are arranged to surround the active area A. With a second acoustic impedance of the first interference structure 121 and the second interference structure 122 and the first acoustic impedance mismatched, the first interference structure 121 and the second interference structure 122 interfere with the acoustic propagation of lateral mode previously discussed. Hence a portion of acoustic wave energy of the lateral modes is reflected into the active area A and transformed to a desirable piston mode perpendicular to the plane of the piezoelectric layer 2. The dimension of the interference structure is carefully selected such that reflection coefficient for lateral mode acoustic waves reflecting off of the edges and transformation from lateral mode acoustic waves to piston acoustic wave mode are maximized, thus improving Qp. The first interference structure 121 and the second interference structure 122 can be made of a conductive or non-conductive material.

The first interference structure 121 is formed by bending the material at the first end portion of the second electrode 12 upward beyond the width of the active area A to form a predetermined angle α against the top surface of the first end portion of the piezoelectric layer 2 and then bending the material again to form a parallel line to the top surface of the first end portion of the piezoelectric layer 2. The second interference structure 122 is formed by bending the material at the second end portion of the second electrode 12 upward beyond the width of the active area A to form a predetermined angle α against the top surface of the second end portion of the piezoelectric layer 2 and then bending the material again to form a parallel line to the top surface of the second end portion of the piezoelectric layer 2. In this embodiment, a portion of the length d1 of the first interference structure 121 is suspended over the first air gap 61 and a portion of the length d1 of the second interference structure 122 is suspended over the second air gap 62, respectively.

Figure 12:
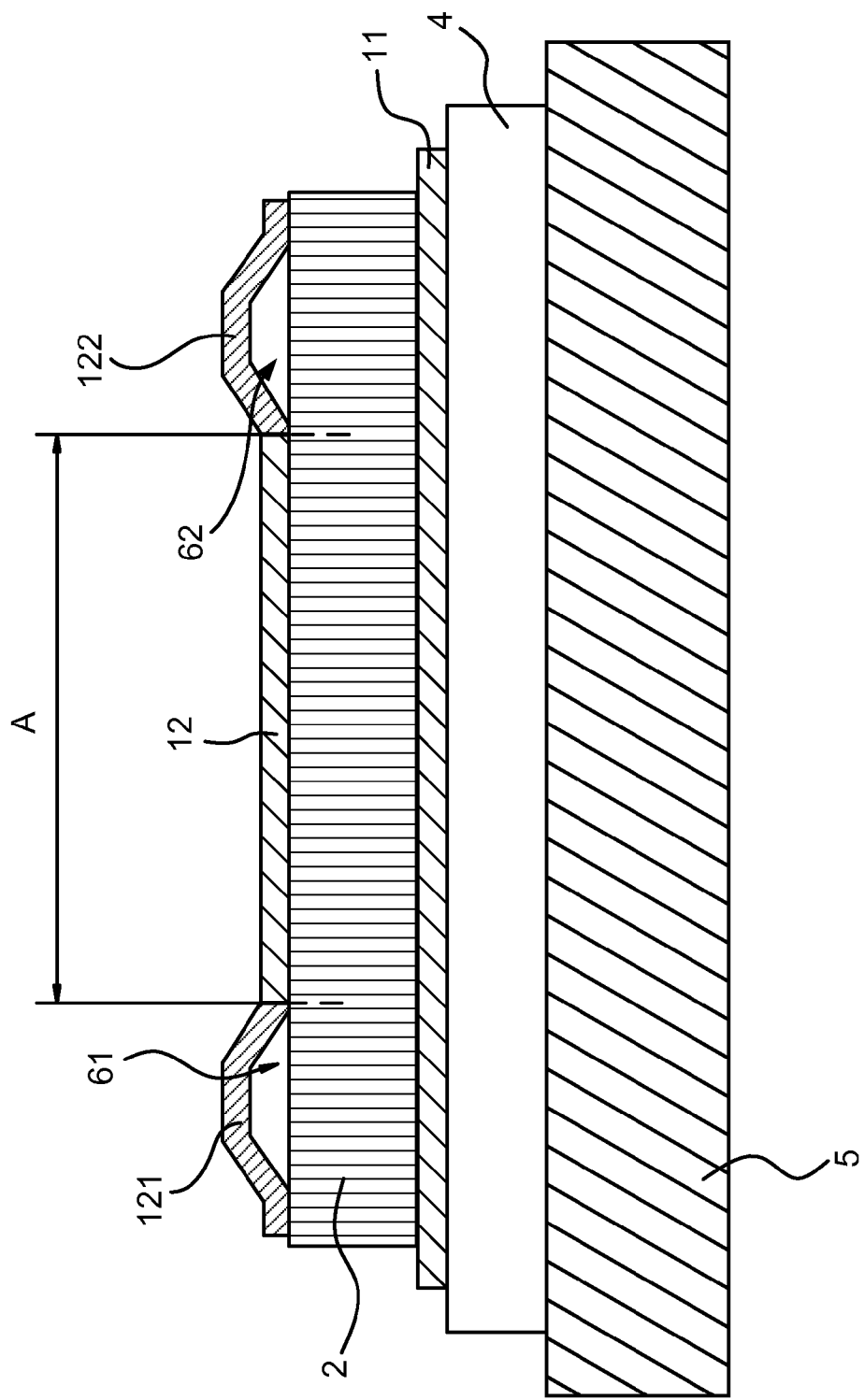
FIG. 12 shows a cross sectional view of a piezoelectric resonator structure with a pair of trapezoid-shaped interference structures on both end portions of the second electrode over the top surface of the piezoelectric layer according to one embodiment of the present invention.

Referring now to FIG. 12, a cross sectional view of a piezoelectric resonator structure with a pair of trapezoid-shaped interference structure on both end portions of the second electrode over the top surface of the piezoelectric layer is shown according to one embodiment of the present invention. The piezoelectric resonator structure has a similar structure as the embodiment shown in FIG. 11. The difference is that the first interference structure 121 and the second interference structure 122 are in a trapezoid shape instead of an arch shape.

The first interference structure 121 and the second interference structure 122 are formed by bending the interference structure material into four sections in a trapezoid shape. A first air gap 61 is formed between the bottom surface of the first interference structure 121 and the top surface of the first end portion of the piezoelectric layer 2, and a second air gap 62 is formed between the bottom surface of the second interference structure 122 and the top surface of the second end portion of the piezoelectric layer 2.

Figure 13:
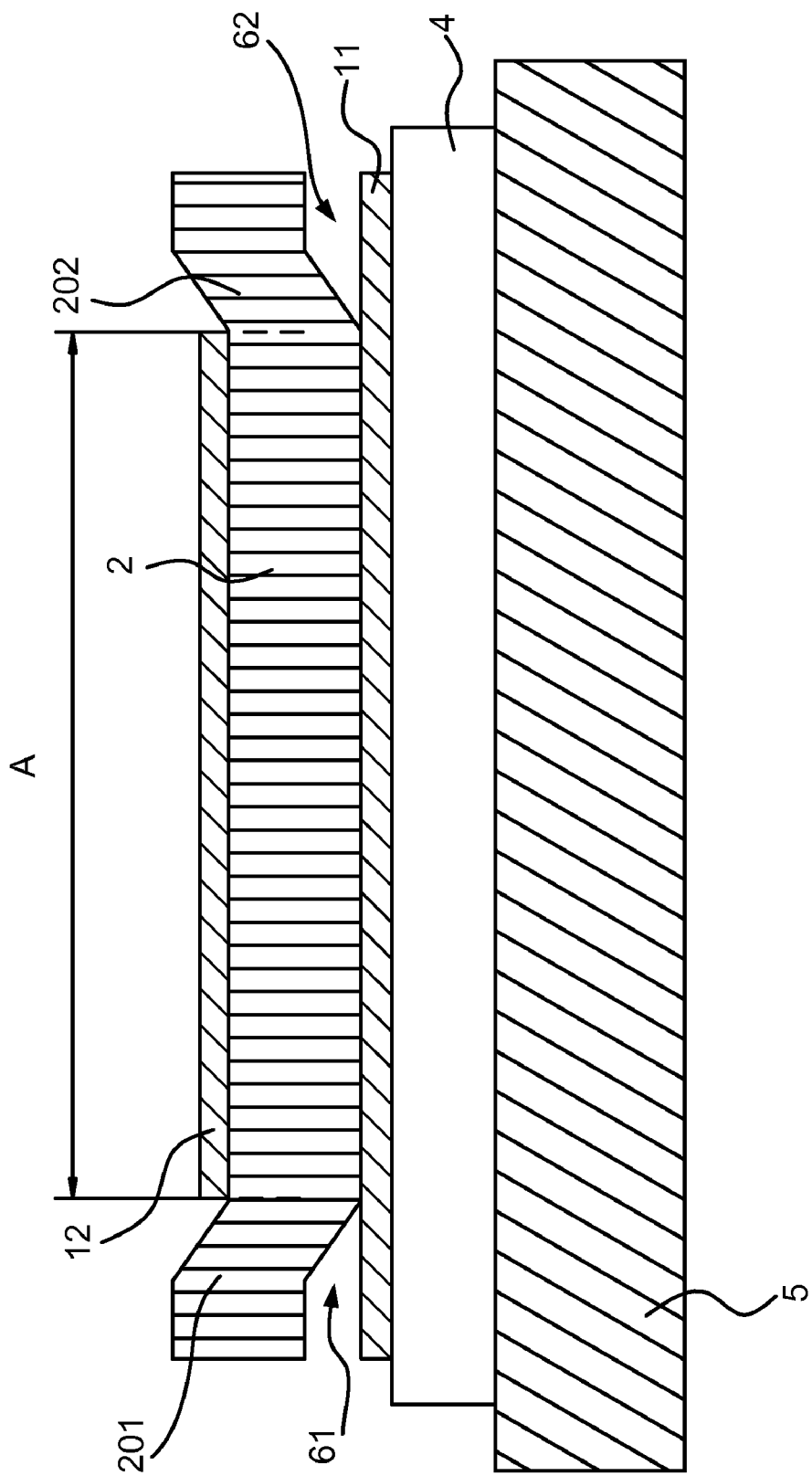
FIG. 13 shows a cross sectional view of a piezoelectric resonator structure with a pair of arch-shaped interference structures on both end portions of the piezoelectric layer over the top surface of the first electrode according to one embodiment of the present invention.

Referring now to FIG. 13, a cross sectional view of a piezoelectric resonator structure with a pair of arch-shaped interference structure on both end portions of the piezoelectric layer is shown according to one embodiment of the present invention. The piezoelectric resonator structure has: (i) a substrate 5, (ii) an acoustic mirror 4, (iii) a first electrode 11, (iv) a piezoelectric layer 2, and (v) a second electrode 12. Each of the substrate 5, the acoustic mirror 4, the first electrode 11, the piezoelectric layer 2 and the second electrode 12 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The overlapped area of body portions of the substrate 5, the acoustic mirror 4, the first electrode 11, the piezoelectric layer 2 and the second electrode 12 is defined as an active area A, which has a first acoustic impedance.

The acoustic mirror 4 can be an air layer or a laminated acoustic wave reflection mirror. The embodiment provides features as follow: a first arch-shaped interference structure 201 is formed at the first end portion of the piezoelectric layer 2 over the top surface of the first end portion of the first electrode 11 or acoustic mirror 4 and a second arch-shaped interference structure 202 is formed at the second end portion of the piezoelectric layer 2 over the top surface of the second end portion of the first electrode 11 or acoustic mirror 4. A first air gap 61 is formed between the bottom surface of the first interference structure 201 and the top surface of the first end portion of the first electrode 11 or acoustic mirror 4, and a second air gap 62 is formed between the bottom surface of the second interference structure 202 and the top surface of the second end portion of the first electrode 11 or acoustic mirror 4, respectively. The first interference structure 201 and the second interference structure 202 are suspended above the first air gap 61 and the second air gap 62 without in contact therewith, respectively. Hence a two-degree of freedom vibration can be generated to allow the first and the second interference structure 201 and 202 suspended above the first air gap 61 and the second air gap 62 to form a second acoustic impedance different from first acoustic impendence of the active area A.

The first interference structure 201 and the second interference structure 202 are connected with the active area A to form a boundary of mismatch impedance. The first interference structure 201 and the second interference structure 202 are arranged to surround the active area A. With the second acoustic impedance of the first interference structure 201 and the second interference structure 202 and the first acoustic impedance mismatched, the first interference structure 201 and the second interference structure 202 interfere with the acoustic propagation of lateral mode previously discussed. Hence a portion of acoustic wave energy of the lateral modes is reflected into the active area A and transformed to a desirable piston mode perpendicular to the plane of the first electrode 11. As a result, $Q_p$ increases. The first interference structure 201 and the second interference structure 202 and the piezoelectric layer 2 can be made of the same or different materials. The first interference structure 201 and the second interference structure 202 are actually located outside of the scope of the active area A. The first interference structure 201 and the second interference structure 202 can be made of a dielectric or non-conductive material. In order to generate the acoustic waves (especially the lateral resonant waves) to produce interaction with the first interference structure 201 and the second interference structure 202, the junction of distal ends of the first interference structure 201 and the second interference structure 202 and the first electrode 11 is preferably positioned close to the boundary of the active area A.

The first end portion of the piezoelectric layer 2 is bent upward beyond the width of the active area A to form a predetermined angle against the top surface of the first end portion of the first electrode 11 and then bent again to form a parallel line to the top surface of the first end portion of the first electrode 11. The second end portion of the piezoelectric layer 2 is bent upward beyond the width of the active area A to form a predetermined angle against the top surface of the second end portion of the first electrode 11 and then bent again to form a parallel line to the top surface of the second end portion of the first electrode 11. In this embodiment, the first interference structure 201 is suspended over the first air gap 61 and the second interference structure 202 is suspended over the second air gap 62, respectively.

The first interference structure 201 and the second interference structure 202, the first electrode 11 form different horizontal elevations in the active area A to generate free vibrations. Therefore, first interference structure 201 and the second interference structure 202 generate a second acoustic impedance mismatching with the first acoustic impedance in the active area A. As a result, leakage of the acoustic energy can be reduced and $Q_p$ improves.

The sizes of the first interference structure 201 and the second interference structure 202 also impact the reflection acoustic energy, and can be adjusted as desired to achieve optimization. For instance, the first interference structure 201 and the second interference structure 202 may be formed in varying thickness. The first interference structure 201 and the second interference structure 202 surrounding the active area A may also be formed in varying widths. Incorporating the varying sizes with the angle and thickness of the piezoelectric layer 2, a fine adjustment can be accomplished to achieve desired performance.

Figure 14:
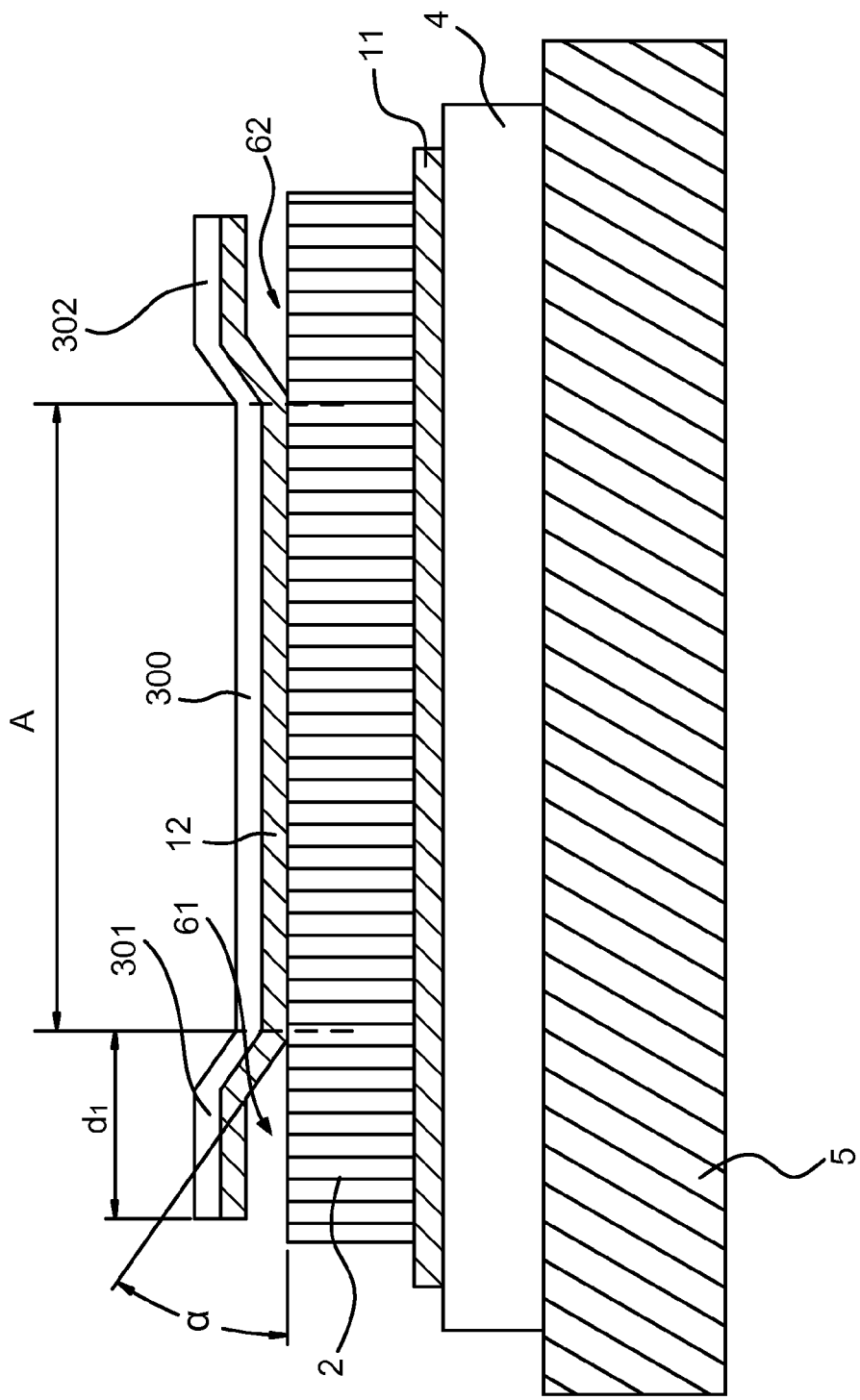
FIG. 14 shows a cross sectional view of a piezoelectric resonator structure with a pair of arch-shaped multi-layered interference structures on both end portions of the piezoelectric layer over the top surface of the piezoelectric layer according to one embodiment of the present invention.

Referring now to FIG. 14, a cross sectional view of a piezoelectric resonator structure with an arch-shaped multi-layered interference structure placed on the first end portion of the piezoelectric layer 2 and an arch-shaped multi-layered interference structure placed on the second end portion of the piezoelectric layer 2 over the top surface of the piezoelectric layer is shown according to one embodiment of the present invention. The piezoelectric resonator structure has: (i) a substrate 5, (ii) an acoustic mirror 4, (iii) a first electrode 11, (iv) a piezoelectric layer 2, (v) a second electrode 12, and (vi) an interference structure 300. Each of the substrate 5, the acoustic mirror 4, the first electrode 11, the piezoelectric layer 2, the second electrode 12 and the interference structure 300 has a top surface, a bottom surface, a first end portion, and an opposite, second end portion. The bottom surface of the acoustic mirror 4 is placed on the top surface of the substrate 5. The bottom surface of the first electrode 11 is placed on the top surface of the acoustic mirror 4. The bottom surface of the piezoelectric layer 2 is placed on the top surface of the first electrode 11. The bottom surface of the second electrode 12 is placed on the top surface of the piezoelectric layer 2. The bottom surface of the interference structure 300 having a first end portion 301 and a second end portion 302 is placed on the top surface of the second electrode 12. The overlapped area of body portions of the substrate 5, the acoustic mirror 4, the first electrode 11, the piezoelectric layer 2 and the second electrode 12 is defined as an active area A, which has a first acoustic impedance.

The second electrode 12 and the interference structure 300 are combined to form a multi-layered structure having a first end portion 301 and a second end portion 302. Beyond the width of the active area A, the first end portion 301 of the multi-layered structure is bent upward in a predetermined angle $\alpha$ against the top surface of the piezoelectric layer 2 and then bent again to be parallel to the top surface of the piezoelectric layer 2 to form a first air gap 61 between the bottom surface of the first end portion 301 of the multi-layered structure and the top surface of the first end portion of the piezoelectric layer 2, and the second end portion 302 of the multi-layered structure is bent upward in a predetermined angle $\alpha$ against the top surface of the piezoelectric layer 2 and then bent again to be parallel to the top surface of the piezoelectric layer 2 to form a second air gap 62 between the bottom surface of the second end portion 302 of the multi-layered structure and the top surface of the second end portion of the piezoelectric layer 2. Reflection acoustic energy can be changed by varying the excessive length d1 of the multi-layered structure over the piezoelectric layer 2. Since the interference structure 300 does not change the mechanical displacement distribution of active area in the direction of the applied electric field, it doesn't degrade Q, of the resonator and has no effect on strength of spurious resonance modes.

Figure 15:
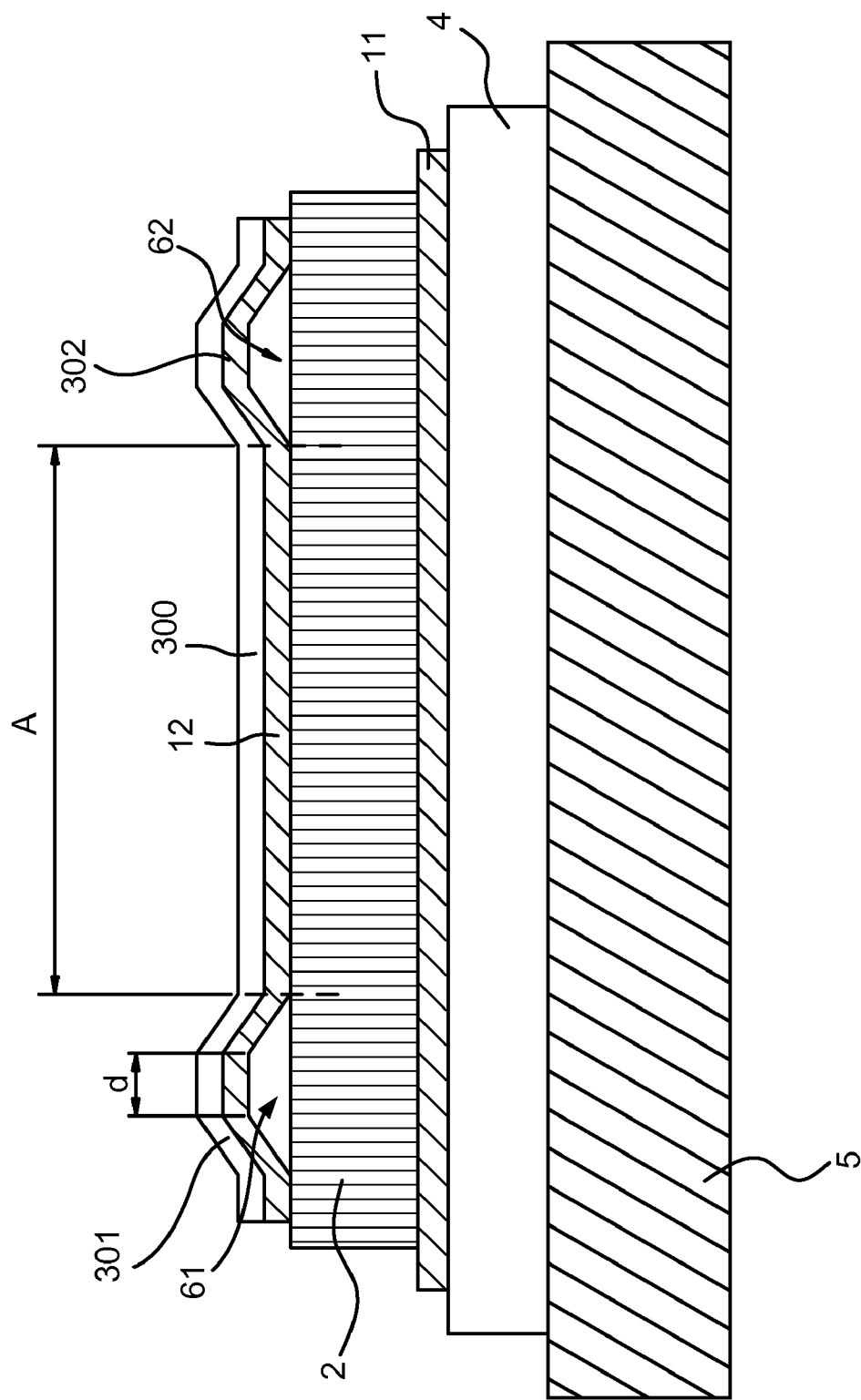
FIG. 15 shows a cross sectional view of a piezoelectric resonator structure with a pair of trapezoid-shaped multi-layered interference structures on both end portions of the piezoelectric layer over the top surface of the piezoelectric layer according to one embodiment of the present invention.

Referring now to FIG. 15, a cross sectional view of a piezoelectric resonator structure with a pair of trapezoid-shaped multi-layered interference structure on both end portions of the piezoelectric layer over the top surface of the piezoelectric layer is shown according to one embodiment of the present invention. The piezoelectric resonator structure has a similar structure as the embodiment shown in FIG. 14. The difference is that the arch-shaped interference structure 301 and 302 are replaced with a multi-layered trapezoid shaped first interference structure 301 and a multi-layered trapezoid shaped second interference structure 302. A first air gap 61 is formed in the space between the bottom surface of the first end portion of the second electrode 12 and the top surface of the first end portion the piezoelectric layer 2, and a second air gap 62 is formed in the space between the bottom surface of the second end portion of the second electrode 12 and the top surface of the second end portion the piezoelectric layer 2, respectively. The top side of the first interference structure 301 and the second interference structure 302 is defined as d. The multi-layered interference structure can be made of a bottom metal layer and a top dielectric layer. The top layer can also be made of conductive or non conductive materials.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A piezoelectric resonator structure, comprising:
   (a) a substrate having a top surface and a bottom surface, a first end portion and an opposite, second end portion, and a body portion defined therebetween;
   (b) an acoustic mirror having a top surface and a bottom surface, a first end portion and an opposite, second end portion, and a body portion defined therebetween, wherein the bottom surface is formed on the top surface of the substrate;
   (c) a first electrode having a top surface and a bottom surface, a first end portion and an opposite, second end portion, and a body portion defined therebetween, wherein the bottom surface is formed on the top surface of the acoustic mirror;
   (d) a piezoelectric layer having a top surface and a bottom surface, a first end portion and an opposite, second end portion, and a body portion defined therebetween, wherein the bottom surface is formed on the top surface of the first electrode;
   (e) a second electrode having a top surface and a bottom surface, a first end portion and an opposite, second end portion, and a body portion defined therebetween, wherein the bottom surface is formed on the top surface of the piezoelectric layer, wherein the overlapped area of body portions of the substrate, the acoustic mirror, the first electrode, the piezoelectric layer and the second electrode is defined as an active area A; and
   (f) a first interference structure extending from the first end portion of the second electrode to form a first air gap between the first interference structure and the first end portion of the piezoelectric layer, and a second interference structure extending from the second end portion of the second electrode to form a second air gap between the second interference structure and the second end portion of the piezoelectric layer, wherein the first interference structure and the second interference structure are made of a conductive material that is different from that of the second electrode, or a non-conductive material, or a dielectric material.

2. The piezoelectric resonator structure of claim 1, wherein the first air gap is formed in the first end portion of the piezoelectric layer and the second air gap is formed in the second end portion of the piezoelectric layer.

3. The piezoelectric resonator structure of claim 1, wherein the first interference structure extending from the first end portion of the second electrode, and the second interference structure extending from the second end portion of the second electrode, are positioned on the top of the first air gap and the second air gap, respectively.

4. The piezoelectric resonator structure of claim 1, wherein the first interference structure is made in an arch shape on the top surface of the piezoelectric layer to form the first air gap, and the second interference structure is made in an arch shape on the top surface of the piezoelectric layer to form the second air gap.

5. The piezoelectric resonator structure of claim 4, wherein the top surfaces of the second electrode and the first and second interference structures are covered with a dielectric layer to form a multi-layered structure having a first end portion and a second end portion, such that the first end portion of the multi-layered structure is made in the arch shape on the top surface of the piezoelectric layer to form the first air gap, and the second end portion of the multi-layered structure is made in the arch shape on the top surface of the piezoelectric layer to form the second air gap.

6. A piezoelectric resonator structure, comprising:
   (a) a substrate having a top surface and a bottom surface, a first end portion and an opposite, second end portion, and a body portion defined therebetween;
   (b) an acoustic mirror having a top surface and a bottom surface, a first end portion and an opposite, second end portion, and a body portion defined therebetween, wherein the bottom surface is formed on the top surface of the substrate;
   (c) a first electrode having a top surface and a bottom surface, a first end portion and an opposite, second end portion, and a body portion defined therebetween, wherein the bottom surface is formed on the top surface of the acoustic mirror;
   (d) a piezoelectric layer having a top surface and a bottom surface, a first end portion and an opposite, second end portion, and a body portion defined therebetween, wherein the bottom surface is formed on the top surface of the first electrode;
   (e) a second electrode having a top surface and a bottom surface, a first end portion and an opposite, second end portion, and a body portion defined therebetween, wherein the bottom surface is formed on the top surface of the piezoelectric layer; and
   (f) an interference structure having a first end portion and a second end portion positioned on the top surface of the second electrode, wherein the width of the interference structure is greater than the width of the second electrode such that a first air gap is formed at the first end portion of the second electrode and a second air gap is formed at the second end portion of the second electrode, respectively,
   wherein the overlapped area of the body portions of the substrate, the acoustic mirror, the first electrode, the piezoelectric layer and the second electrode is defined as an active area A.

7. The piezoelectric resonator structure of claim 6, wherein a first support to the interference structure is positioned between the first end portion of the interference structure and the top surface of the piezoelectric layer, and a second support to the interference structure is positioned between the second end portion of the interference structure and the top surface of the piezoelectric layer, such that the first air gap is formed between the first support and the first end portion of the second electrode and the second air gap is formed between the second support and the second end portion of the second electrode, respectively.

8. The piezoelectric resonator structure of claim 6, wherein the interference structure has a first arch interference structure defined by the first end portion of the interference structure and a second arch interference structure defined by the second end portion of the interference structure, wherein the first arch interference structure is suspended over the top surface of the first end portion of the second electrode and the top surface of the first end portion of the piezoelectric layer to form the first air gap, and the second arch interference structure is suspended over the top surface of the second end portion of the second electrode and the top surface of the second end portion of the piezoelectric layer to form the second air gap.

9. The piezoelectric resonator structure of claim 6, wherein the interference structure has a first trapezoid interference structure defined by the first end portion of the interference structure and a second trapezoid interference structure defined by the second end portion of the interference structure, wherein the first trapezoid interference structure is positioned on the top surface of the first end portion of the second electrode and the first end portion of the piezoelectric layer to form the first air gap, and the second trapezoid interference structure is positioned on the top surface of the second end portion of the second electrode and the second end portion of the piezoelectric layer to form the second air gap.

10. A piezoelectric resonator structure, comprising:
   (a) a substrate having a top surface and a bottom surface, a first end portion and an opposite, second end portion, and a body portion defined therebetween;
   (b) an acoustic mirror having a top surface and a bottom surface, a first end portion and an opposite, second end portion, and a body portion defined therebetween, wherein the bottom surface is formed on the top surface of the substrate;
   (c) a first electrode having a top surface and a bottom surface, a first end portion and an opposite, second end portion, and a body portion defined therebetween, wherein the bottom surface is formed on the top surface of the acoustic mirror;
   (d) a piezoelectric layer having a top surface and a bottom surface, a first end portion and an opposite, second end portion, and a body portion defined therebetween, wherein the bottom surface is formed on the top surface of the first electrode;
   (e) a second electrode having a top surface and a bottom surface, a first end portion and an opposite, second end portion, and a body portion defined therebetween, wherein the bottom surface is formed on the top surface of the piezoelectric layer; and
   (f) a first interference structure having a first end portion and a second end portion, positioned on the top surface of the second electrode with one of the first end portion and the second end portion sitting at the first end portion of the second electrode to form a first air gap, and a second interference structure having a first end portion and a second end portion, positioned on the top surface of the second electrode with one of the first end portion and the second end portion sitting at the second end portion of the second electrode to form a second air gap, wherein the overlapped area of the body portions of the substrate, the acoustic mirror, the first electrode, the piezoelectric layer and the second electrode is defined as an active area A.

11. The piezoelectric resonator structure of claim 10, wherein the second end portion of the first interference structure sits at the first end portion of the second electrode and the first end portion of the first interference structure is suspended over the first end portion of the second electrode and the first end portion of the piezoelectric layer to form the first air gap, and the second end portion of the second interference structure sits at the second end portion of the second electrode and the first end portion of the second interference structure is suspended over the second end portion of the second electrode and the second end portion of the piezoelectric layer to form the second air gap.

12. The piezoelectric resonator structure of claim 10, wherein the first interference structure comprises a first trapezoid interference structure having a first end portion and a second end portion, positioned on the top surface of the second electrode with the second end portion at the first end portion of the second electrode and the first end portion in the active area to form the first air gap, and wherein the second interference structure comprises a second trapezoid interference structure having a first end portion and a second end portion, positioned on the top surface of the second electrode with the second end portion at the second end portion of the second electrode and the first end portion in the active area to form the second air gap.

13. The piezoelectric resonator structure of claim 10, wherein the first interference structure comprises a first trapezoid interference structure having a first end portion and a second end portion, positioned such that the first end portion is placed on the top surface of the first end portion of the second electrode, and the second end portion is placed on the top surface of the first end portion of the piezoelectric layer so as to define the first air gap, and wherein the second interference structure comprises a second trapezoid interference structure having a first end portion and a second end portion, positioned such that the first end portion is placed on the top surface of the second end portion of the second electrode and the second end portion is placed on the top surface of the second end portion of the piezoelectric layer so as to define the second air gap.

14. The piezoelectric resonator structure of claim 10, wherein the second end portion of the first interference structure is placed at the first end portion of the second electrode and the first end portion of the first interference structure is suspended over the active area to form the first air gap, and the second end portion of the second interference structure is placed at the second end portion of the second electrode and the first end portion of the second interference structure is suspended over the active area to form the second air gap.

15. A piezoelectric resonator structure, comprising:
(a) a substrate having a top surface and a bottom surface, a first end portion and an opposite, second end portion, and a body portion defined therebetween;
(b) an acoustic mirror having a top surface and a bottom surface, a first end portion and an opposite, second end portion, and a body portion defined therebetween, wherein the bottom surface is formed on the top surface of the substrate;
(c) a first electrode having a top surface and a bottom surface, a first end portion and an opposite, second end portion, and a body portion defined therebetween, wherein the bottom surface is formed on the top surface of the acoustic mirror;
(d) a piezoelectric layer having a top surface and a bottom surface, a first end portion and an opposite, second end portion, and a body portion defined therebetween, wherein the bottom surface is formed on the top surface of the first electrode;
(e) a second electrode having a top surface and a bottom surface, a first end portion and an opposite, second end portion, and a body portion defined therebetween, wherein the bottom surface is formed on the top surface of the piezoelectric layer, wherein a first end portion of the second electrode is made in a trapezoid shape on the top surface of the piezoelectric layer to form a first air gap, and a second end portion of the second electrode is made in a trapezoid shape on the top surface of the piezoelectric layer to form a second air gap,
wherein the overlapped area of the body portions of the substrate, the acoustic mirror, the first electrode, the piezoelectric layer and the second electrode is defined as an active area A.

16. The piezoelectric resonator structure of claim 15, wherein the top surface of the second electrode is covered with a dielectric layer to form a multi-layered structure having a first end portion and a second end portion, such that the first end portion of the multi-layered structure is made in the trapezoid shape on the top surface of the piezoelectric layer to form the first air gap, and the second end portion of the multi-layered structure is made in the trapezoid shape on the top surface of the piezoelectric layer to form the second air gap.

17. A piezoelectric resonator structure, comprising:
(a) a substrate having a top surface and a bottom surface, a first end portion and an opposite, second end portion, and a body portion defined therebetween;
(b) an acoustic mirror having a top surface and a bottom surface, a first end portion and an opposite, second end portion, and a body portion defined therebetween, wherein the bottom surface is formed on the top surface of the substrate;
(c) a first electrode having a top surface and a bottom surface, a first end portion and an opposite, second end portion, and a body portion defined therebetween, wherein the bottom surface is formed on the top surface of the acoustic mirror;
(d) a piezoelectric layer having a top surface and a bottom surface, a first end portion and an opposite, second end portion, and a body portion defined therebetween, wherein the bottom surface is formed on the top surface of the first electrode, and wherein the first end portion of the piezoelectric layer is made in an arch shape on the top surface of the first electrode to form a first air gap, and the second end portion of the piezoelectric layer is made in an arch shape on the top surface of the first electrode to form a second air gap; and
(e) a second electrode having a top surface and a bottom surface, a first end portion and an opposite, second end portion, and a body portion defined therebetween, wherein the bottom surface is formed on the top surface of the piezoelectric layer,
wherein the overlapped area of the body portions of the substrate, the acoustic mirror, the first electrode, the piezoelectric layer and the second electrode is defined as an active area A.

* * * * *